(12) United States Patent
Gupta et al.

US007260798B2

(10) Patent No.: US 7,260,798 B2
(45) Date of Patent: Aug. 21, 2007

(54) COMPILATION OF REMOTE PROCEDURE CALLS BETWEEN A TIMED HDL MODEL ON A RECONFIGURABLE HARDWARE PLATFORM AND AN UNTIMED MODEL ON A SEQUENTIAL COMPUTING PLATFORM

(75) Inventors: Sanjay Gupta, Noida (IN); Vipul Kulshrestha, Noida (IN); Yogesh Badaya, Noida (IN); Suresh Krishnamurthy, Noida (IN); Kingshuk Banerjee, Noida (IN)

(73) Assignee: Mentor Graphics Corporation, Wilsonville, OR (US)

( * ) Notice: Subject to any disclaimer, the term of this patent is extended or adjusted under 35 U.S.C. 154(b) by 403 days.

(21) Appl. No.: 11/023,592

(22) Filed: Dec. 29, 2004

(65) Prior Publication Data

US 2005/0198606 A1    Sep. 8, 2005

(30) Foreign Application Priority Data

Dec. 29, 2003   (IN)   .................. 1633/DEL/2003

(51) Int. Cl.
*G06F 17/50*    (2006.01)
(52) U.S. Cl. ................................ 716/5; 716/4; 716/18
(58) Field of Classification Search .................... None
See application file for complete search history.

(56) References Cited

U.S. PATENT DOCUMENTS 6,701,501 B2 *  3/2004  Waters et al. ................... 716/8
7,035,781 B1 *  4/2006  Flake et al. ..................... 703/14
7,146,300 B2 * 12/2006  Zammit et al. ................. 703/13

2004/0111252 A1    6/2004  Burgun et al.

OTHER PUBLICATIONS

Mike Santarini of EE Times entitled Testbench Integrated on Emulator (May 24, 2004), printed Jul. 27, 2004, 3 pages, http://www.eedesign.com/news/showArticle.jhtml?articleid=20900488&kc=4217, San Jose, California.
Mike Santarini of EE Times entitled Axis Adds Assertion Checking to Emulation/Acceleration (Aug. 19, 2002), printed Jul. 27, 2004, 4 pages, http://www.eedesign.com/news/showArticle.jhtml?articleId=17407909&kc=4217.
Mike Santarini of EE Times entitled Axis' Xtreme Gets Behavioral Boost (Oct. 18, 2001), printed Jul. 27, 2004, 2 pages, http://www.us.design-reuse.com/news/news332.html.

(Continued)

*Primary Examiner*—Leigh M. Garbowski
(74) *Attorney, Agent, or Firm*—Banner & Witcoff, Ltd.

(57) ABSTRACT

A system is described for managing interaction between an untimed HAL portion and a timed HDL portion of the testbench, wherein the timed portion is embodied on an emulator and the un-timed portion executes on a workstation. Repeatability of verification results may be achieved even though the HAL portion and the HDL portion run in parallel with each other. A communication interface is also described for synchronizing and passing data between multiple HDL threads on the emulator domain and simultaneously-running multiple HAL threads on the workstation domain. In addition, a remote procedural-call-based communication link, transparent to the user, is generated between the workstation and the emulator. A technique provides for repeatability for blocking and non-blocking procedure calls. FSMs and synchronization logic are automatically inferred to implement remote procedural calls. A subset of behavioral language is identified that combines the power of conventional modeling paradigms with RTL performance.

21 Claims, 35 Drawing Sheets

OTHER PUBLICATIONS

Xtreme-II: The First Verification Environmental for Platform Verification, printed Jul. 27, 2004, 3 pages, http://www.verisity.com/products/xtremeii.html.

Testbench Acceleration: Synthesizing e Testbenches Using Versity's eCelerator, printed on Jul. 27, 2004, 6 pages, http://www.verisity.com/resources/whitepaper/accelration.html.

Accelerated Verification Process Automation, printed on Jul. 27, 2004, 6 pages, http://www.verisity.com/resources/whitepaper/spextreme.html.

SpeXtreme: VPA System for High Performance Chip- and System-Level Verification, printed on Jul. 27, 2004, 2 pages, http://www.verisity.com/products/spextreme.html.

* cited by examiner ta = TIME ADVANCING CYCLE
in = INTERNAL TIME STOPPING CYCLE
bl = BLOCKING CYCLE
nb = NON-BLOCKING CYCLE

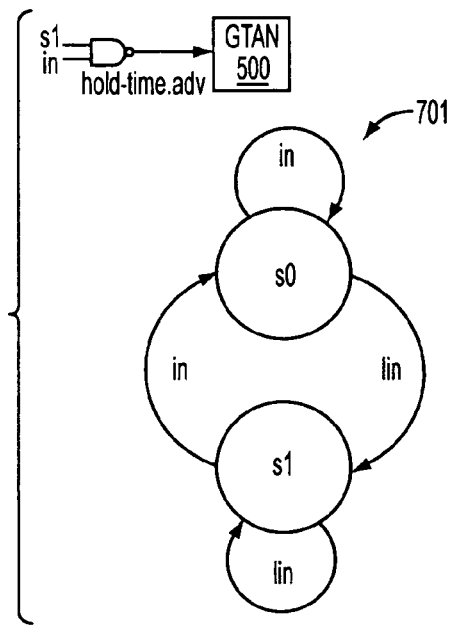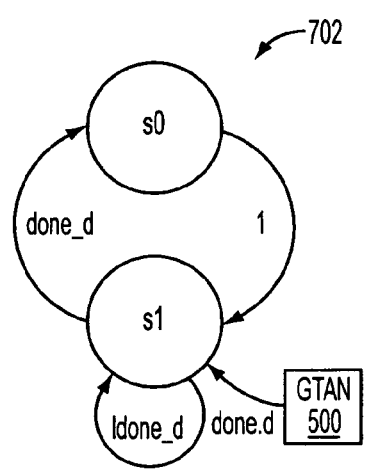
FIG. 7A  FIG. 7B
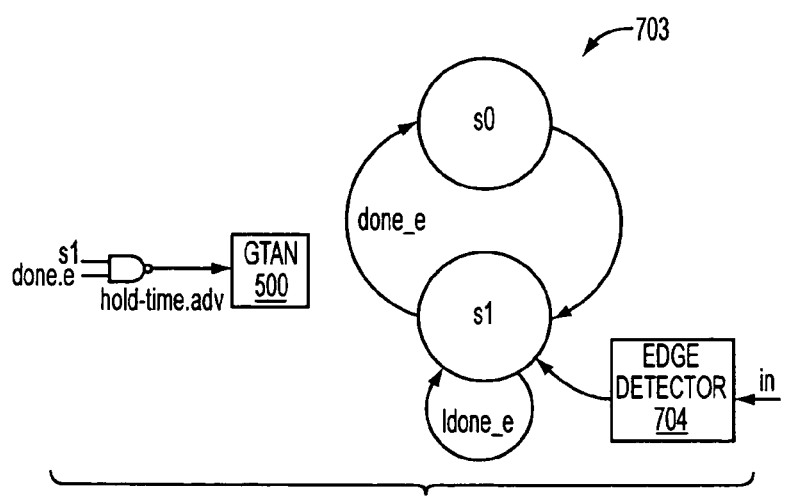
FIG. 7C

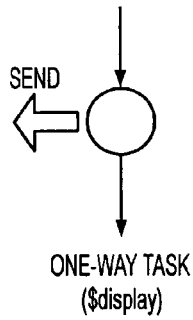
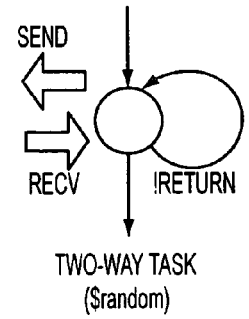
ONE-WAY TASK ($display)
TWO-WAY TASK ($random)
FIG. 9
FIG. 10
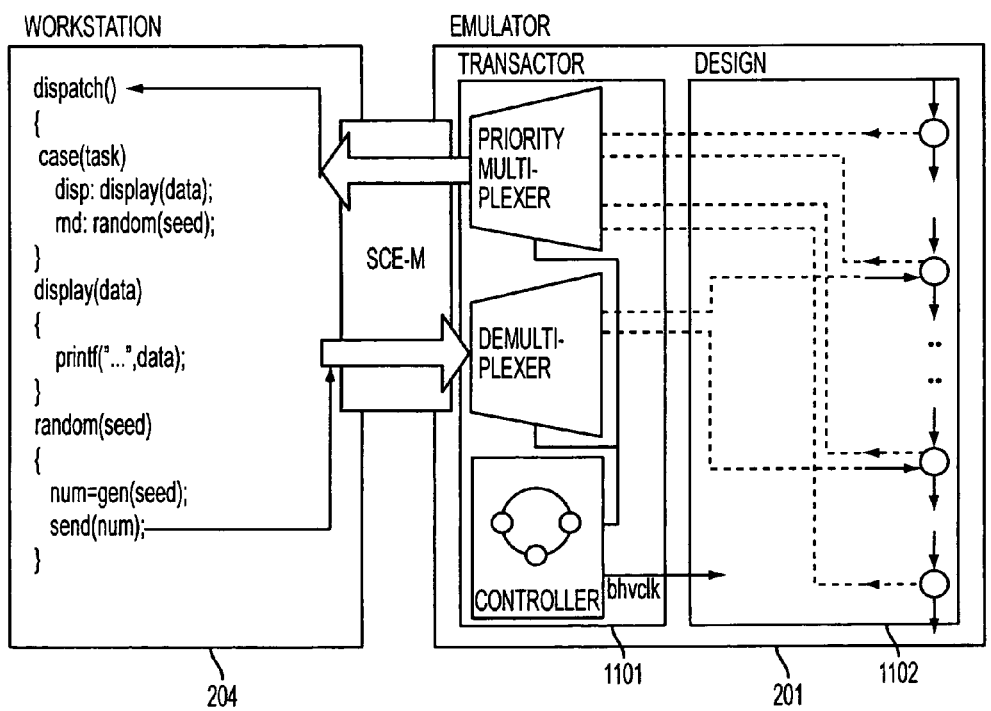
FIG. 11

MODIFIED TIME ADVANCE
NETWORK FOR ILPC

COMPILATION OF REMOTE PROCEDURE CALLS BETWEEN A TIMED HDL MODEL ON A RECONFIGURABLE HARDWARE PLATFORM AND AN UNTIMED MODEL ON A SEQUENTIAL COMPUTING PLATFORM

RELATED APPLICATIONS

The present application claims priority to Indian Provisional Patent Application Number 1633/Del/2003, filed Dec. 29, 2003, entitled "System and Method for Synthesizing Remote Procedure Calls Between a Timed HDL Model Executed in a Re-Configurable Hardware Platform and an Untimed Model Executing in a Workstation," incorporated by reference herein as to its entirety.

FIELD OF THE INVENTION

Aspects of the present invention are generally directed to verification of hardware description language (HDL) designs, and more particularly to transaction-based verification that is based on Inter Language Procedure calls (ILPC) to provide communication interface between HDL based models and untimed testbench models.

BACKGROUND OF THE INVENTION

Hardware Description Languages (HDLs) are predominantly used to describe integrated circuit designs. Various HDLs exist in the market today such as Very High Speed Integrated Circuit HDL (VHDL), Verilog, and System Verilog. HDL may be used to describe a design at various levels of abstraction. For instance, VHDL supports many possible levels/styles of design description. These styles differ primarily in how closely they relate to the underlying hardware. Some levels focus more on the behavior and dataflow of a design, while other levels focus more on the structural and timing aspects of the design.

For example, integrated circuit designs may be described at the dataflow level of abstraction, often called the register transfer level (RTL). In this intermediate level of abstraction, a design is described in terms of how data moves through the design. At the heart of most digital systems today are registers, and an RTL model describes how information is passed between registers in the design. This movement is synchronized at specific points of time which are indicated by the changes of values of a special design signal commonly known as a clock. Typically, while an RTL model of the combinational logic portions of the design is described at a relatively high level, the timing and operation of registers in the design are described more specifically. RTL is therefore an intermediate level that allows the drudgery of combinational logic to be simplified (and automatically generated by logic synthesis tools) while the more important parts of the circuit, the registers, are more completely specified. Once the design is specified in an RTL model, RTL synthesis tools translate, or synthesize, this model into a still lower level model of abstraction, i.e., into a gate-level structural model. Synthesis refers to the process of transformation of a design model from a higher level of abstraction to a lower level. These transformations typically try to improve upon a set of objective metrics (e.g., area, speed, power dissipation) of a design.

Once a design has been described, to increase likelihood of first pass success, the design is typically verified for proper functionality prior to physical fabrication as an integrated circuit chip. While being tested, an HDL model of a design is called a Design Under Test (DUT). This DUT (which is an RTL design model) is simulated using a testbench. The testbench generates a set of input test vectors, or stimuli, and applies the stimuli to the DUT. The testbench also reads a set of output test vectors from the DUT in response to the stimuli. The testbench collects the responses made by the DUT against a specification of correct results.

A testbench in its traditional form is described at a behavioral level and defines the environment for the DUT in its target system. Behavioral HDL, which is the currently highest level of abstraction supported in HDL, describes a design in terms of what it does (or how it behaves) rather than in terms of its structural components and interconnection between them. A behavioral model specifies a relationship between signals within the design as well as inputs to and outputs from the design. When creating a behavioral model of a design, one describes the operation of the design over time. The usage of time is a critical distinction between behavioral descriptions of circuits and lower-level descriptions such as a dataflow level of abstraction.

In a behavioral description, time may be expressed precisely as absolute delays between related events (such as the propagation delays within gates and on wires), or time may be a factor by defining the sequential ordering of events. Synthesis tools currently attempt to transform behavioral HDL models into lower-level HDL models. However, synthesis tools presently do not attempt to maintain the identical behavior in actual circuitry as defined in the behavioral model. In other words, exact time sequencing of the design elements are not preserved in synthesis. Therefore, such synthesis tools can not be used for synthesizing behavioral testbenches.

Design verification may be performed using a variety of methods. For example, software based simulators are the most commonly used verification tools. Software simulators have an advantage in that they can accept HDL at any level of abstraction, such as a behavioral level of abstraction, thus providing a way to simulate both a DUT (in RTL) and its testbench (in behavioral description). However, simulators have a disadvantage in that, for large designs, simulators typically can achieve a speed of not more than a few tens to hundreds of clock cycles per second (cps).

To increase the overall simulation speed, co-simulation approaches have been used, in which the behavioral testbench runs on a software simulator and the RTL DUT is mapped and executed onto a reconfigurable hardware platform. The reconfigurable hardware platform may be implemented as, e.g., a plurality of reconfigurable hardware elements, such as a set of general-purpose processors and/or Field Programmable Gate Arrays (FPGAs).

To execute the DUT on the reconfigurable hardware platform (also referred to herein as an emulator), the RTL model of the DUT is first translated into a structural model using an RTL synthesis tool. This structural model, known as a netlist, describes a circuit in terms of interconnection of gate level components. The emulator may implement the RTL model of the DUT on, for example, a collection of reconfigurable hardware elements such as an array of field-programmable gate arrays (FPGAs) or the like.

The structural level models a system as a collection of logic gates and their interconnection to perform a desired function. The structural level is a representation that is closer to the physical realization of a system. Thereafter, the emulator runs the structural level description of the DUT at the actual binary gate levels and is therefore, considerably faster than a simulator being used for the same purpose. However, the testbenches in a co-simulation approach are still written in behavioral HDL and are run on a software platform, also known as a simulator. The emulator and the simulator must frequently communicate with each other in order to maintain synchronization with each other. Such frequent communication taxes the resources of the emulator and simulator, thus reducing the potential speed at which the system may operate. Because of this limitation, co-simulation speeds are typically only three to ten times pure software simulation speeds. Co-simulation has other disadvantages, such as that they require memories to be re-modeled in terms of the memories available in the emulator.

Newer techniques have been developed that allow a testbench to be described using a high-level algorithmic language (HAL) such as C, C++, and SystemC. The industry as a whole is beginning to adopt the usage of such HALs to describe the Testbench at higher level of abstraction and take advantage of algorithmic property of HALs. Using HALs, a relatively new transaction-based verification methodology has also been adopted to improve the performance and verification coverage. In this recently-developed methodology, a testbench is re-structured into a timed portion (also known as a transactor) and an un-timed portion.

The timed portion, or transactor, of the testbench is responsible for direct signal level interaction with the DUT. A transactor either decomposes an untimed transaction into a set of clocked events or composes a set of clocked events into a message. When receiving messages, transactors freeze DUT clocks for a sufficient time to allow messages to be fully decomposed before providing clocked data to a DUT. Transactors also freeze DUT clocks when sending a message, and they allow message composition operations to complete before new clocked data is received from the DUT. The un-timed portion, on the other hand, is purely algorithmic, and interacts with the timed portion using abstract transactions. The un-timed portion does not utilize the concept of a clock.

By dividing the testbench into timed and un-timed portions, improvements may be realized in the overall functional coverage of the design verification process. Moreover, using the above methodology, it is easier to write a testbench and achieve better functional verification coverage. However, the entire testbench, i.e., both the timed and un-timed portions, remains as software to be executed on the workstation. Accordingly, what performance improvements are realized by using this methodology are still somewhat limited.

Several approaches have been taken to improve the interaction between the timed and un-timed portions of a testbench. These approaches are: signal-level connections, high-level abstract message passing, and function-call-based interaction. Using signal-level connections, interactions with the untimed HAL domain are triggered based on events on the signals on the boundary of the timed and untimed portions of the testbench. This approach is the most commonly used approach and is implemented using a programming language interface (PLI), typically provided by conventional simulators. High-level abstract message passing is based on a communication protocol defined by the well-known Standard Co-Emulation Modeling Interface (SCE-MI) standard. The use of this approach is described in more detail below. Function-call-based interaction is a relatively new approach, wherein data transfers are performed using function call arguments. System Verilog has adopted this approach, which is known as Direct Programming Interface (DPI).

Other attempts have been made to improve the performance of this new timed/un-timed methodology through co-simulation by using a hardware accelerator or emulator to run the DUT model while a HAL simulator runs the testbench on a workstation. However, this approach requires substantial communication overhead. In co-simulation, communication between the hardware-implemented DUT and the software-implemented testbench is event-based and at the signal level, and therefore occurs frequently. Unfortunately, due to this high communication overhead between the DUT and the testbench, co-simulation improves verification speed for most designs by, at most, a factor of three to ten.

Still other attempts have been made to improve verification performance. The use of SCE-MI has provided more than an order of magnitude improvement in performance by modeling transactors at the RTL level and synthesizing them to execute, not as software, but as hardware on an emulator. SCE-MI is, in a nutshell, an interface that bridges two different modeling environments, each of which supports a different level of modeling abstraction. More particularly, SCE-MI is a transaction-based methodology that can be used for both Verilog and VHDL designs, and that provides a low-level interface and mechanism for passing messages between the HDL domain (which is on a reconfigurable hardware platform, such as an accelerator or an emulator) and the HAL domain (which is on a sequential computation platform, such as a software-executing workstation). On the HAL domain, SCE-MI provides a set of functions that are callable to send or receive messages to or from the HDL domain. The HAL domain may create multi-cycle transaction packets and send the packets to the HDL domain as a single message, or receive multi-cycle output as a single message from the HDL domain, which is then decomposed on the HAL domain into multiple packets so that they may be processed. Likewise, the HDL domain may receive these transactions (For example multi-cycle stimulus packets), and will decompose them into multiple cycle level signals that are then applied to the DUT. On the HDL domain, there is a pre-defined set of input and output hardware macros that the designer may use to send or receive any messages to or from the corresponding HAL domain.

Using SCE-MI, the testbench, including algorithms for stimulus generation and DUT output processing, may be written in the HAL domain. The stimuli generated by the testbench may be communicated to the HDL domain at the transaction level, whereby the HDL side receives these transactions at a high level, decomposes them into cycle level signals, and applies the cycle level signals to the DUT. Similarly, the HDL domain collects the DUT outputs, creates transaction packets containing the outputs, and sends the transaction packets to the HAL domain, which then decomposes the transaction packets into output data. Due to the packetizing and decomposition that must occur, communication between the HDL domain and the HAL domain uses a much faster clock than the design clock used by the DUT. The transactor runs on this faster clock and can control the design clock during message decomposition and packetizing. The user/designer instantiates a clock macro in the transactor through which the design clock of the DUT is generated and controlled. By using the transactor to control the design clock, the transactor is able to determine and control when the DUT clock should be stopped and when it should be allowed to run. In this methodology, the faster clock is not controllable and is commonly known as Un-Controlled clock (uclock).

However, SCE-MI as described above has some problems. First, SCE-MI is difficult to use and design with. SCE-MI is a very complex modeling paradigm with complicated communication protocols, placing significant burdens on the designer. The APIs and structural macros of SCE-MI are very low level and therefore difficult to use. Also, to use SCE-MI properly, the designer must understand the concept and appropriate usage of uncontrolled-clocks. This places yet another burden on the designer. Additionally, SCE-MI is inherently non-deterministic, and so verification results may be non-repeatable in certain situations. This is a major limitation since verification and debugging issues can be very difficult if verification runs are not repeatable. Finally, SCE-MI requires that the testbench transactors be written only at the RTL level to be synthesizable to run on the reconfigurable hardware platform. Thus, with SCE-MI, the complete HDL side must be written at the RTL level.

System Verilog provides yet another modeling interface for communication between the HDL and HAL models, called the Direct Programming Interface (DPI). DPI allows imported and exported tasks or functions to be called on both the HDL domain as well as the HAL domain. Thus, functions or tasks can be written in HDL yet called from the HAL domain (e.g., using the C language). Such functions and tasks are known as exported functions and tasks. Likewise, functions can be written on the HAL domain and called from the HDL domain as tasks or functions. Such functions and tasks are known as imported functions and tasks. In general, DPI works well, is easy to use, and does not require that the designer learn any new language or methodology. Still, DPI is extension of System Verilog, and hence the entire system (both the DUT and the testbench) is limited to running on a System Verilog software simulator. Accordingly, little if any performance improvement is realized by using DPI.

BRIEF SUMMARY OF THE INVENTION

Accordingly, aspects of the present invention solve some or all of the above problems by providing a transparent and user-friendly system for managing interaction between a workstation and a re-configurable hardware computing platform (also referred to as an emulator) where the timed portion of a testbench is embodied on the emulator and the un-timed portion executes on the workstation.

Further aspects of the present invention are directed to providing for, and in many cases even guaranteeing, the repeatability of verification results and execution of a system in the simulation time domain. Because the workstation domain and the emulator domain of the system run in parallel with each other, problems need to be (and are) overcome in providing for such repeatability.

Still further aspects of the present invention are directed to a general purpose, easy to use, abstract communication interface that may be used for synchronizing and passing data between multiple hardware description language (HDL) threads on the emulator domain and a simultaneously-running high-level algorithmic language (HAL) thread on the workstation domain.

Even further aspects of the present invention are directed to automatically generating a remote procedural-call-based communication link between the workstation and the emulator. This communication link is capable of handling the complex communication protocol and data transfer between the workstation and the emulator and yet still allowing for guaranteed repeatability. Furthermore, the communication link is completely transparent to the users, thus not burdening users with too many additional requirements.

Even further aspects of the present invention are directed to accelerating the simulation of a transaction-based modeling environment using an emulator. A technique is provided to guarantee repeatability for both blocking and non-blocking procedure calls, and finite state machines (FSM) and synchronization logic suitable to be executed on the emulator are automatically inferred to enable implementation of remote procedural calls. The FSM runs on an automatically-inferred free-running, uncontrolled clock that controls the simulation time advance of the system and also synchronizes the execution of remote procedural calls with other compiled HDL models for both design and testbench components.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein:

FIGS. 7A, 7B and 7C show illustrative finite state machine states for various timing control statements.

FIGS. 9 and 10 show one-way and two-way system tasks.

FIG. 11 shows the system task infrastructure.

DETAILED DESCRIPTION OF ILLUSTRATIVE EMBODIMENTS

Aspects of the present invention will be described in terms of transaction-based verification, wherein the testbench is partitioned into both an algorithmic untimed portion and a behavioral timed Verilog HDL portion. The untimed portion of the testbench is modeled using a high-level algorithmic language (HAL) and runs as software in a workstation. The timed portion of the testbench, also known as the transactor, is modeled using HDL and runs on a reconfigurable hardware emulator. The interface between the untimed and the timed portions of the system is through a simple and intuitive function/task call based modeling paradigm, similar to the System Verilog DPI interface. Function calls may be made from HDL-based model to HAL-based model or vice-versa. These functions may consume simulation time and may be blocking or non-blocking. This modeling paradigm enables easy adoption of transaction-based verification methodology in a hardware-assisted verification system.

The automatic synthesis of this modeling interface is also described, wherein the modeling interface provides that the algorithmic untimed portion of the testbench runs as software on a workstation and that the behavioral timed portion runs on a reconfigurable hardware emulator. This is synthesized by the testbench synthesis technology described herein. In addition, an infrastructure is automatically synthesized for optimal communication between the timed and untimed portions and allows for deterministic, repeatable results.

Figure 21:
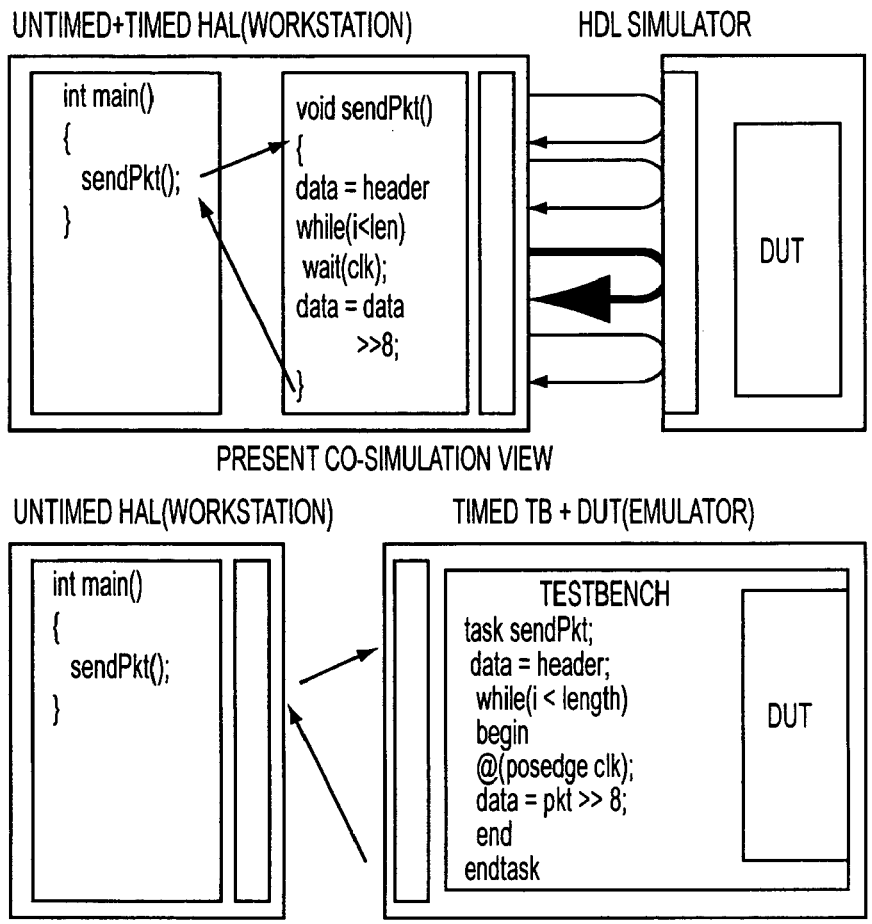
FIG. 21 is a functional block diagram of a typical transaction based verification system, as well as an illustrative configuration wherein the timed portion of a HAL is modeled in behavioral HDL.

In a typical transaction-based verification system, the DUT is modeled at the RTL level in HDL and is simulated in a HDL simulator, while the untimed and timed portions of the testbench are modeled and executed in a HAL environment. Although the testbench is structured to be transaction-based, the HAL environment needs to interact with the HDL simulator at event or cycle boundaries, as shown for example in the upper half of FIG. 21. Such a system suffers from performance bottlenecks due to the frequent event/cycle level interactions between the HAL kernel and the HDL simulator. In the proposed methodology, the timed portion of the testbench may be modeled in behavioral HDL, which may be synthesized and executed in an accelerator or an emulator. This partitioning is illustratively shown in the lower half of FIG. 21. In this latter case, interaction between the HAL and HDL domains occurs only at transaction boundaries, thereby reducing the number of transactions and providing higher performance. Performance is further enhanced due to the fact that the timed portion of the testbench itself is accelerated. The proposed modeling paradigm further enables easy adoption of a transaction-based methodology by providing simple and intuitive function calls. Moreover, this modeling paradigm has also been adopted by the SystemVerilog Language DPI.

1.0 Testbench Synthesis

The following testbench synthesis technique is also described in U.S. patent application Ser. No. 10/972,361, filed Oct. 26, 2004, entitled "Method and System for Hardware Accelerated Verification of Digital Circuit Design and its Testbench," and incorporated by reference herein as to its entirety.

Figure 1:
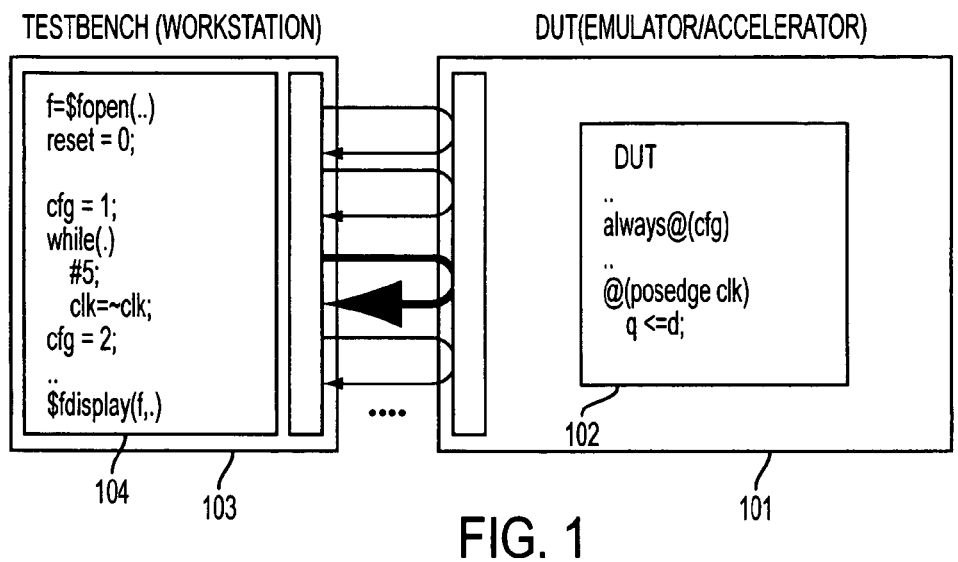
FIG. 1 is a functional block diagram of a conventional co-simulation configuration.

Modern verification often uses a co-simulation approach. In a co-simulation approach, as shown in FIG. 1, a testbench 104 (which is coded in a behavioral level of abstraction) runs on a software platform 103, and a DUT 102 (coded in RTL) is mapped to a reconfigurable hardware platform 101. Unfortunately, due to high communication overheads (both platforms need to synchronize every time simulation-time/delta-cycles advance in simulation), the simulation speed improvement has remained within a few multiple (3-10×) of the software simulation speed for most designs.

As already mentioned, the DUT 102 may be modeled at the RTL level of abstraction. Traditional RTL synthesis tools synthesize such models into structural forms that can be directly mapped onto the reconfigurable elements of the emulator. The testbench 104 is generally written in behavioral HDL, which conventionally cannot be executed on emulators because the available synthesis tools can only translate RTL models into structural forms.

However, aspects of the present invention allow behavioral HDL models in general and testbenches in particular to be translated into structural forms suitable for execution on emulators. Testbench synthesis differs from behavioral synthesis in many ways. Its objective is to achieve correct and optimal execution of the testbench on a hardware platform and not actual implementation on a silicon device. It allows a more relaxed modeling style in the input description, and at the same time matches all of the HDL simulation semantics. Additional complexities over behavioral synthesis include matching software simulation semantics whenever possible, and even in all cases. For example, last-driver-win semantics in the case of multiple drivers, delta delay semantics and optimal execution of testbench-specific constructs such as #delays, $time, force-release, etc. Even though there has been research on behavioral synthesis, nobody has yet to achieve it successfully.

Figure 2:
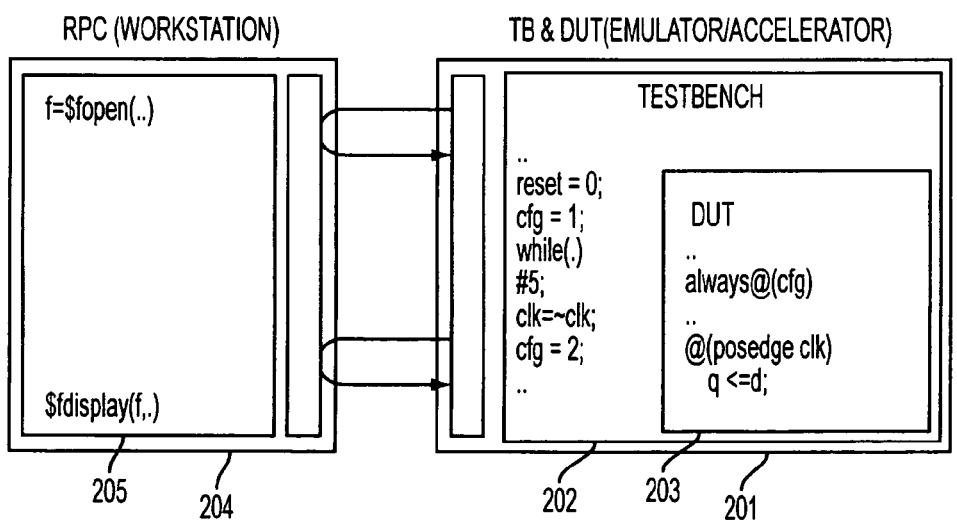
FIG. 2 is a functional block diagram of an illustrative verification system.

Accordingly, FIG. 2 shows an example of a configuration where the entire simulation model including a DUT 203 and a testbench 202 has been mapped onto a reconfigurable hardware platform 201. A workstation 204 handles system calls that require dynamic support of the operating system (like file I/O, display, etc.) made by the model.

The reconfigurable hardware platform 201 has both the DUT 203 and its testbench 202 mapped onto it. This mapped model of the DUT 203 and the testbench 202 may need to communicate with the workstation 204 for system tasks such as file IO, display, etc. In this example, these system tasks are handled at the workstation 204 by a software application 205 written in a High Level Verification Language (HVL). At the workstation 204, a software simulator is not required. Instead, an automatically generated design specific HVL model (using, e.g., C++) may be used that executes system tasks. Communication between the software application 205 and the mapped model 202, 203 is implemented by a software interface layer 206 through a standard co-emulation modeling interface (SCE-MI) 207.

Figure 3:
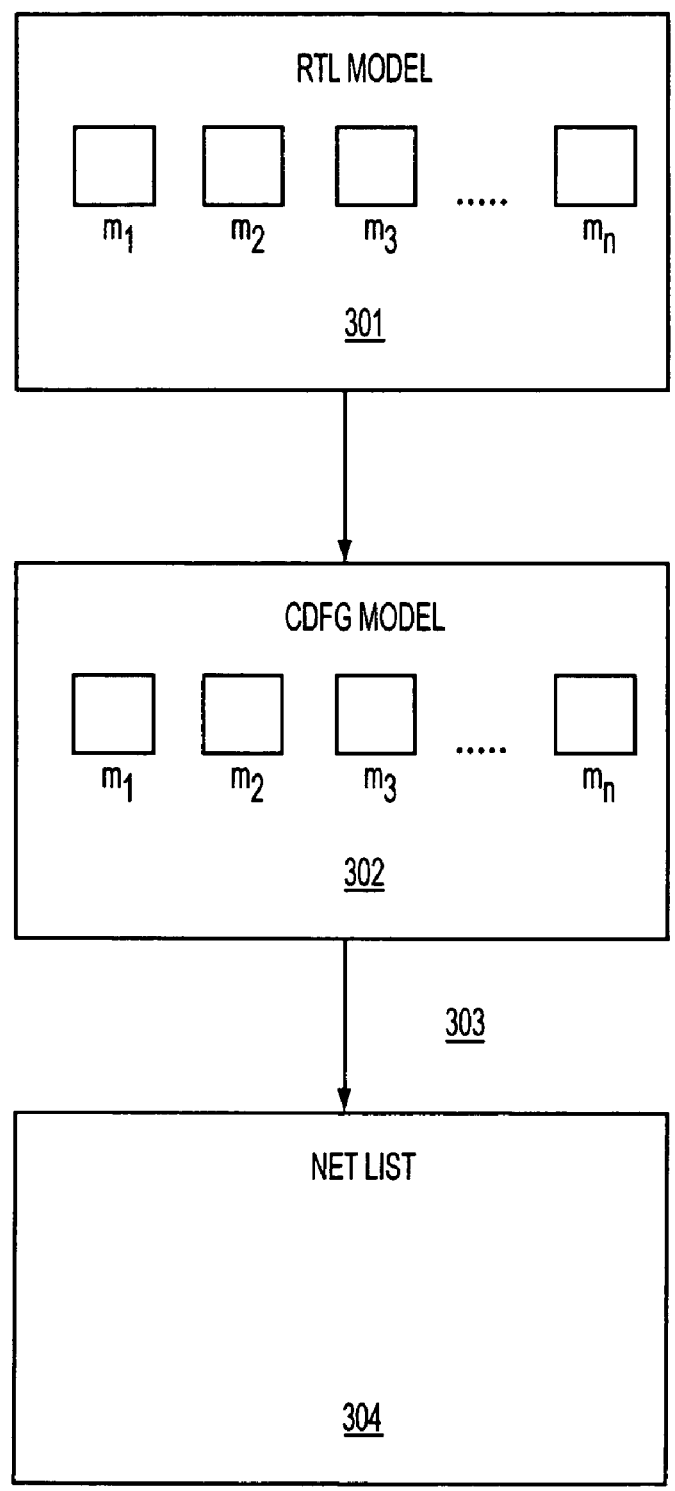
FIG. 3 is a flowchart depicting illustrative steps of RTL synthesis.

FIG. 3 illustrates an illustrative high-level flow of a synthesis tool for conversion of RTL into a structural form suitable for mapping onto a reconfigurable hardware platform. An input HDL description 301, having a plurality of sub-modules $m_1, m_2, m_3 \ldots m_n$, is converted into a set of RTL Control Data Flow Graphs (CDFG) 302 for each of the sub-modules $m_1, m_2, m_3 \ldots m_n$. This intermediate CDFG model 302 is then mapped to a gate level netlist 304 through known mapping and optimization techniques 303. Reconfigurable hardware platforms typically accept and implement such gate level netlist formats. The RTL model 301, in which the DUT is typically defined, is a synchronous model and is therefore easily convertible into the CDFG model 302, which is further easily convertible into the gate level netlist 304.

On the other hand, a behavioral HDL model, in which a testbench is typically defined, is inherently asynchronous. This means that the conversions shown in FIG. 3 are not conventionally applicable to testbench synthesis. At a macro level, a behavioral HDL model may be visualized as a group of concurrent blocks generating events and executing statements that are asynchronous to one another. To synthesize a behavioral HDL model into an implementable netlist, a new clock, called herein a "behavioral clock," is introduced. The behavioral clock is sufficiently fast such that it may be aligned to coincide with each needed asynchronous event, thereby effectively causing each asynchronous event to be synchronous with respect to the behavioral clock.

Figure 4:
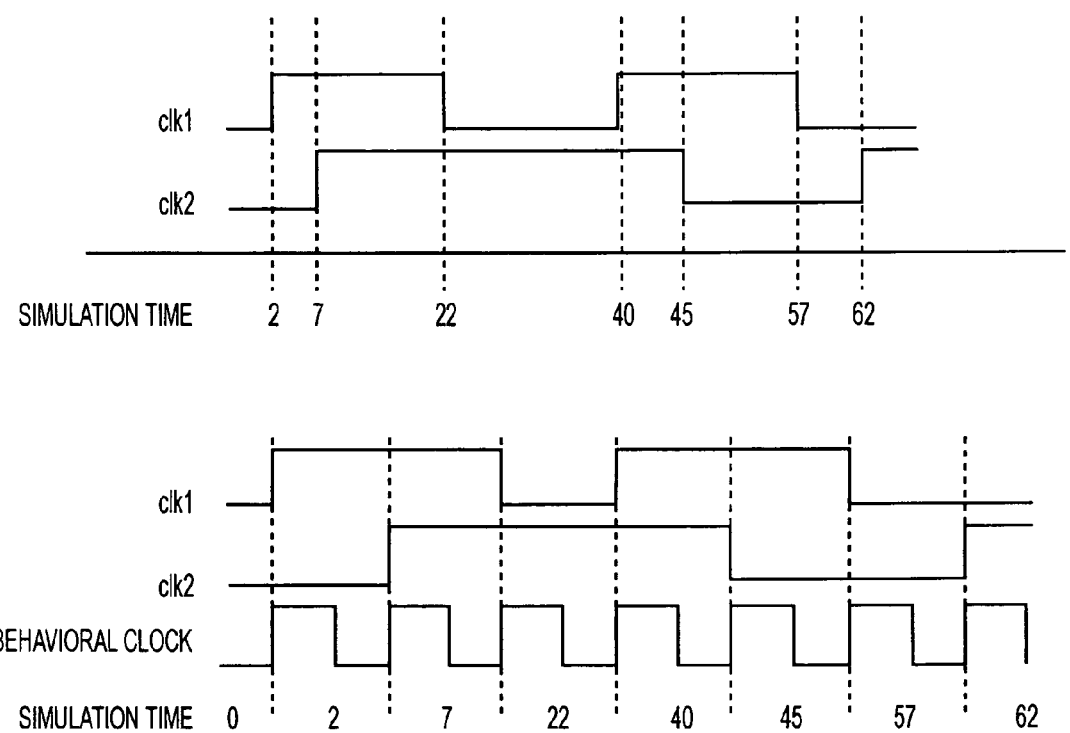
FIG. 4 is an illustrative waveform diagram showing how asynchronous events may be made synchronous with respect to a fast running clock.

For example, FIG. 4 is an illustrative waveform diagram showing how asynchronous events are made synchronous with respect to the behavioral clock. All emulation activities (e.g. signal value changes, time advance, zero delay execution, etc.) are synchronized to the edges of the behavioral clock. The network produces an ordered set of time points, on successive behavioral clock cycles, corresponding to the precise time points needed by any of the computations within the testbench or DUT. Thus, any time point needed by any computation is associated with one or more behavioral clock cycles. Time points that are not needed by any computation may be skipped. In this way, the transformed behavioral model may now be modeled as a multi-cycle, implicit style finite state machine (FSM).

Each concurrent procedural block in the behavioral model may be converted into a FSM, and each timing control statement for each concurrent procedural block may be mapped to a state in the respective FSM. These FSM states transition according to the sequential execution order of the statements within the concurrent procedural blocks, and the FSMs are clocked by the behavioral clock. All such statements are executed in sequence, where one time controlling group of statements passes the control flow to the next group of statements in the form of a DONE signal, which in turn becomes the START signal for the next statement. In each of these FSMs, some of the states may advance the simulation time and some may not. A counter controlled by the FSMs maintains the current simulation time.

For the correct sequencing to occur among the concurrent procedural blocks, the states associated with the timing-control statements may transition to their next state at the appropriate time with respect to similar state transitions in others of the concurrent procedural blocks. Wait/event control statements may be generated depending on design signal value changes, and simple next state transition logic may be used to sequence the control statements.

For delay-control statements, special inter-connecting logic, referred hereinafter as a global time advance network (GTAN), is introduced. The GTAN network may also be modeled as a FSM running on the behavioral clock. The GTAN network may maintain a complete timing queue in the reconfigurable hardware platform. At a particular time in the simulation time, different ones of the concurrent procedural blocks (such as always/initial blocks) contributing different delays may be inserted in this queue.

As mentioned earlier, the behavioral testbench is converted into an equivalent FSM (or set of FSMs) running on the behavioral clock. Each simulation time state controlling a group of statements (such as #, @, or wait) represents a state in the FSM and is referred to as a time advancing state. When delta cycles (i.e., cycles that do not advance the simulation time) need to be executed (for zero delay loops or event chains, or for non-blocking assignments maturing etc.) the corresponding FSM enters in a simulation time stopping state.

When an FSM is in a time advancing state, the FSM contributes a non-zero delay value to the GTAN. During the simulation cycles, if more than one FSM in the system is in a time advancing state, then the GTAN calculates the minimum delay from all the contributing concurrent procedural blocks and advances the simulation time by the minimum delay value. When an FSM is in a time stopping state, that FSM contributes zero delay value to the GTAN, thus stopping the time advance across the system. When a zero delay loop is encountered, additional behavioral clock cycles are consumed by the GTAN without any advancement of the simulation time.

A design may typically have few zero delay blocks, few finite delay blocks and few unknown delay blocks (such as a block that is waiting for some event to occur). All zero delay blocks may be executed in delta time without spending any simulation time. This means that simulation time may be stopped while zero delay blocks are executed. A time advance enable signal may be used to control the start/stop of simulation time. This time advance enable signal may be an input to all of the blocks that are waiting for completion of some finite time. The time advance enable signal would be true in any of the following conditions:

- If execution is waiting for maturity of some finite delay (#delay construct);
- If execution is waiting for some event on a signal (@ construct);
- If execution is waiting on a signal that is zero (wait construct); or
- If execution is at the end of an initial block.

All of the blocks that are waiting for the completion of some finite delay (delay primitive) will spend simulation time only if both the conditions mentioned below are true:

- Local execution control is given to the finite delay statement in question; and
- The time advance enable signal is set to indicate that no zero delay block is getting executed anywhere.

Thus, the time advance enable signal is a global input running across the hierarchies whose job is to synchronize the various procedural blocks.

Figure 5:
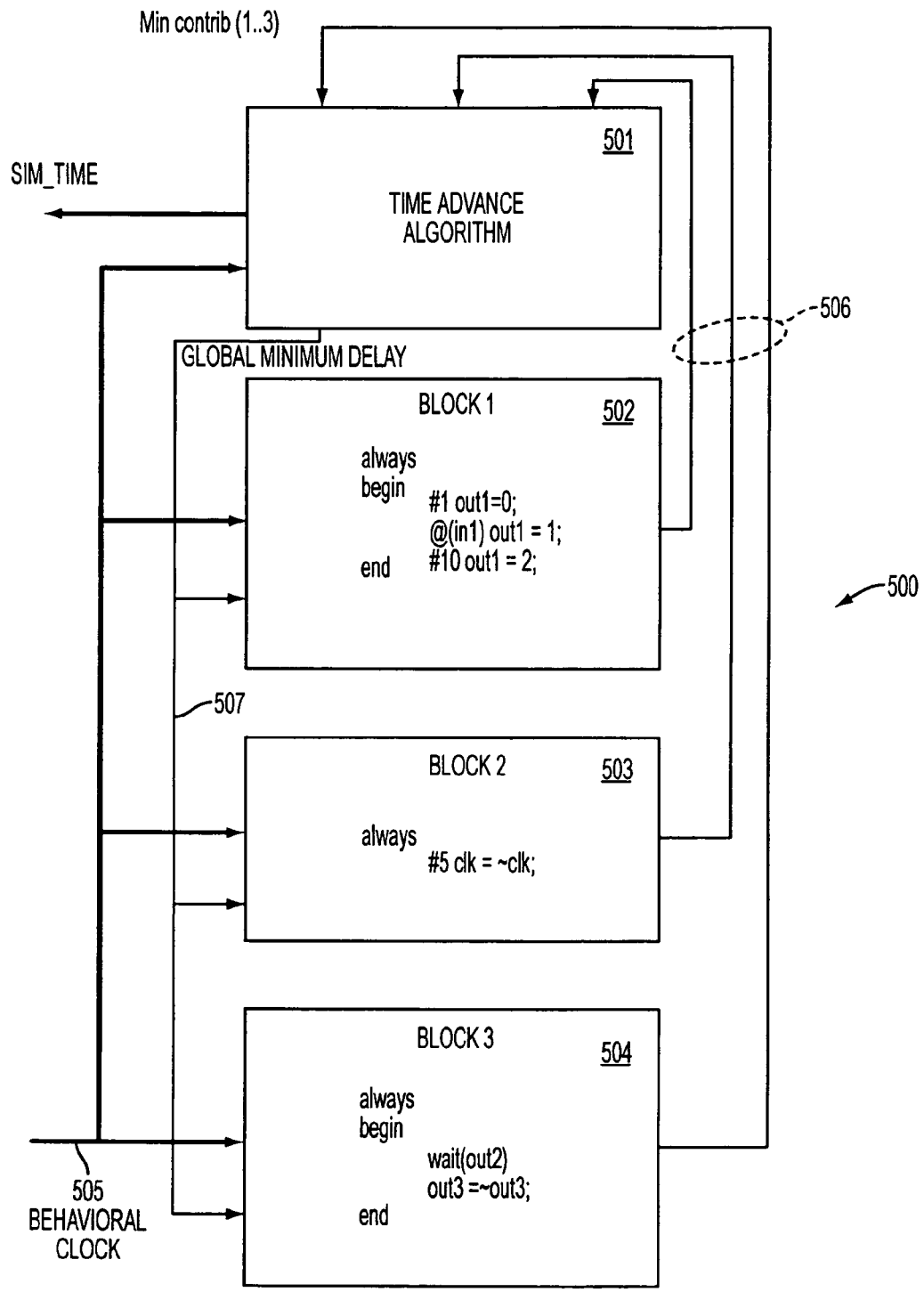
FIG. 5 is an illustrative functional block diagram of a Global Time Advance Network.

FIG. 5 shows how an illustrative GTAN 500 controls the execution of the FSMs of the concurrent blocks with respect to the simulation time. In this example, FSMs 502, 503, 504 of concurrent procedural blocks, as well as a GTAN time advance algorithm FSM 501, are timed using, and responsive to, a behavioral clock 505. The FSMs 502, 503, 504 inform the time advance algorithm FSM 501 about their respective delay states via communication paths 506, thereby contributing to the time queue maintained by the GTAN 500. The GTAN 500, and in particular the time advance algorithm FSM 501, calculates the global minimum delay of the network and advances the simulation time by that value. The time advance algorithm FSM 501 then communicates the determined global minimum delay to all the concurrent blocks via communication paths 507. This would cause those states with no more than the minimum time remaining for their maturity to transition to their next respective states.

Figure 6:
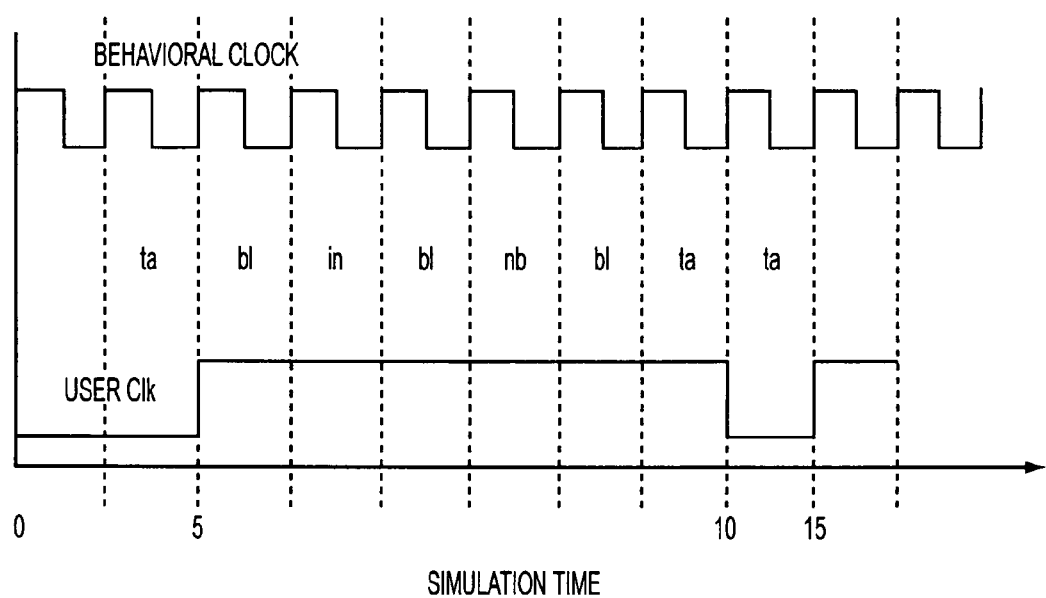
FIG. 6 is an illustrative timing diagram for a simulation cycle.

A simulation cycle may be expected to include a time advance cycle followed by zero or more zero-delay cycles. These zero-delay cycles may be blocking, non-blocking or internal cycles. The GTAN 500 may create a blocking cycle when wait/event-control statements mature as a result of signal value changes. When no more blocking cycles are required, the GTAN 500 may create a non-blocking cycle. Whether or not a non-blocking cycle is created would depend on whether there were any non-blocking assignments during the blocking activity. An internal cycle may be created when a concurrent procedural block requires a special state, e.g., a breaking state for a zero-delay data dependent loop. During internal cycles, wait/event-control state transitions may be suspended. FIG. 6 shows a timing diagram for an illustrative simulation cycle.

As previously mentioned, behavioral testbenches may be converted into RTL, which then may be mapped to a reconfigurable hardware platform using standard RTL synthesis and optimization techniques. Described below are examples of transformations from behavioral level to the RTL level of abstraction that may be implemented.

EXAMPLE

The following is an illustrative description of how a simple DUT-testbench pair might be created in accordance with various aspects of the present invention, and how a behavioral model may be transformed into a format suitable for being implemented on a reconfigurable hardware platform. In this example, the design being modeled is a simple switching system that is often used to control lights from the bottom and top of a staircase in a home. In particular, such a design has two switches that control the same light. If either of the switches is operated—that is, if the state of either switch changes—then the light also changes state. Thus, there are two inputs in this design, which are called herein switch1 and switch2. There is also one output, which will be called herein bulb_on. A Boolean logic expression that captures this design would be:

bulb_on=(switch1 is on AND switch2 is off) OR (switch1 is off AND switch2 is on).

Figure 13:
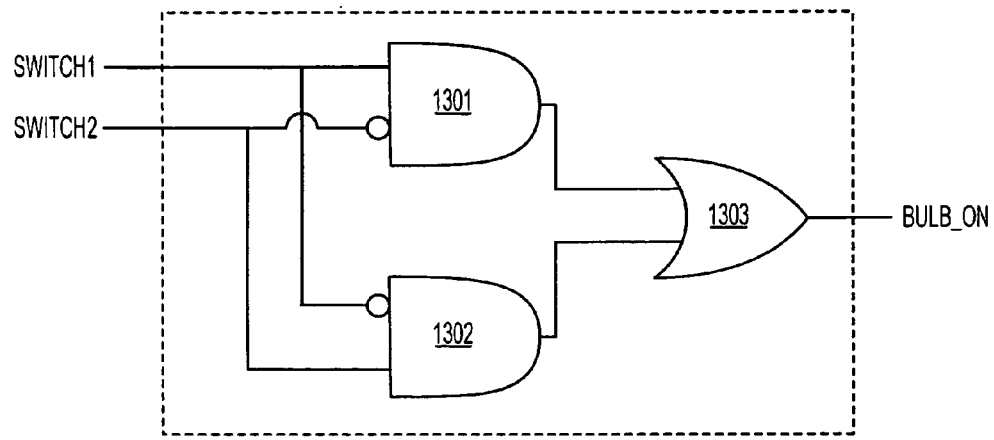
FIG. 13 is an illustrative schematic diagram of a logic design used to exemplify aspects of the present invention.

This logical expression is shown in terms of logic gates in FIG. 13, which shows two AND gates 1301, 1302 coupled to an OR gate 1303. The AND gates 1301, 1302 each receive the switch1 and switch2 inputs and output their results to the OR gate 1303. If either of the outputs of the AND gates 1301, 1302 is true, then the output of the OR gate 1303 is also true, meaning that bulb_on would be true (which means that the light would be in an on state).

The testbench in this example would be designed to generate all possible combinations of the two inputs, switch1 and switch2, and for each combination the output bulb_on would be checked to ensure that bulb_on is in the expected and correct state. A behavioral model for such a testbench may appear as follows:

```
DUT instance(switch1, switch2, bulb_on);
// Generate all possible scenarios and check the output for correctness.
initial
begin
    switch1 = 0; switch2 = 0;
    #1 ->check;
    switch1 = 0; switch2 = 1;
    #1 ->check;
    switch1 = 1; switch2 = 0;
    #1 ->check;
    switch1 = 1; switch2 = 1;
    #1 ->check;
end
// Check if output is correct.
always @(check)
begin
    if(switch1^switch2 != bulb_on)
        $display("FAILED: switch1 = %b, switch2 = %b,
        bulb_on = %b(expected = %b)",
        switch1, switch2, bulb_on, switch1^switch2);
end
```

Figure 14:
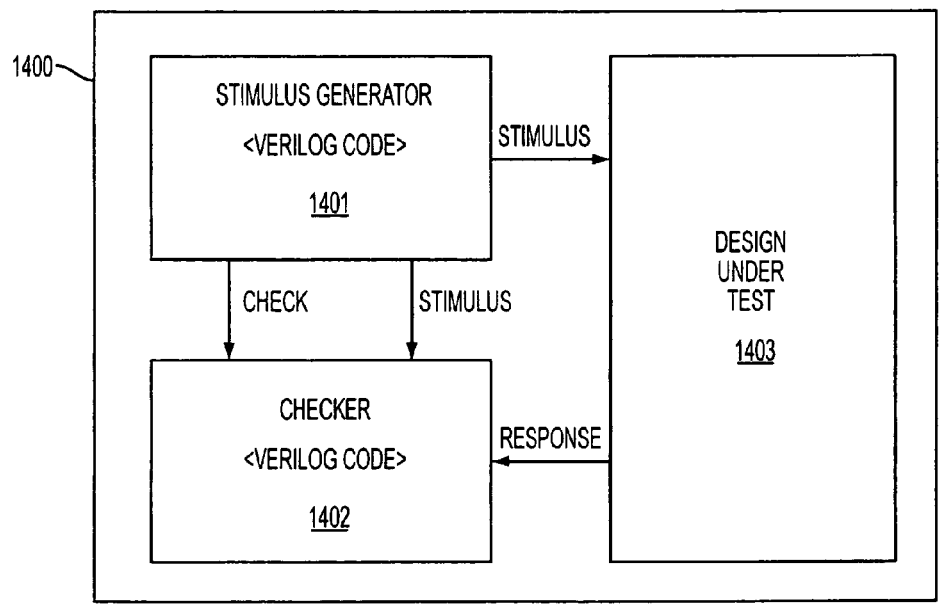
FIG. 14 is an illustrative functional block diagram of a reconfigurable hardware platform configured.

In accordance with aspects of the present invention, both the DUT and the testbench may be implemented onto the same reconfigurable hardware platform. Such a configuration is shown in FIG. 14, where a stimulus generator 1401, a checker 1402, and the DUT 1403 are all implemented on a reconfigurable hardware platform 1400 such as a hardware emulator.

Figure 15:
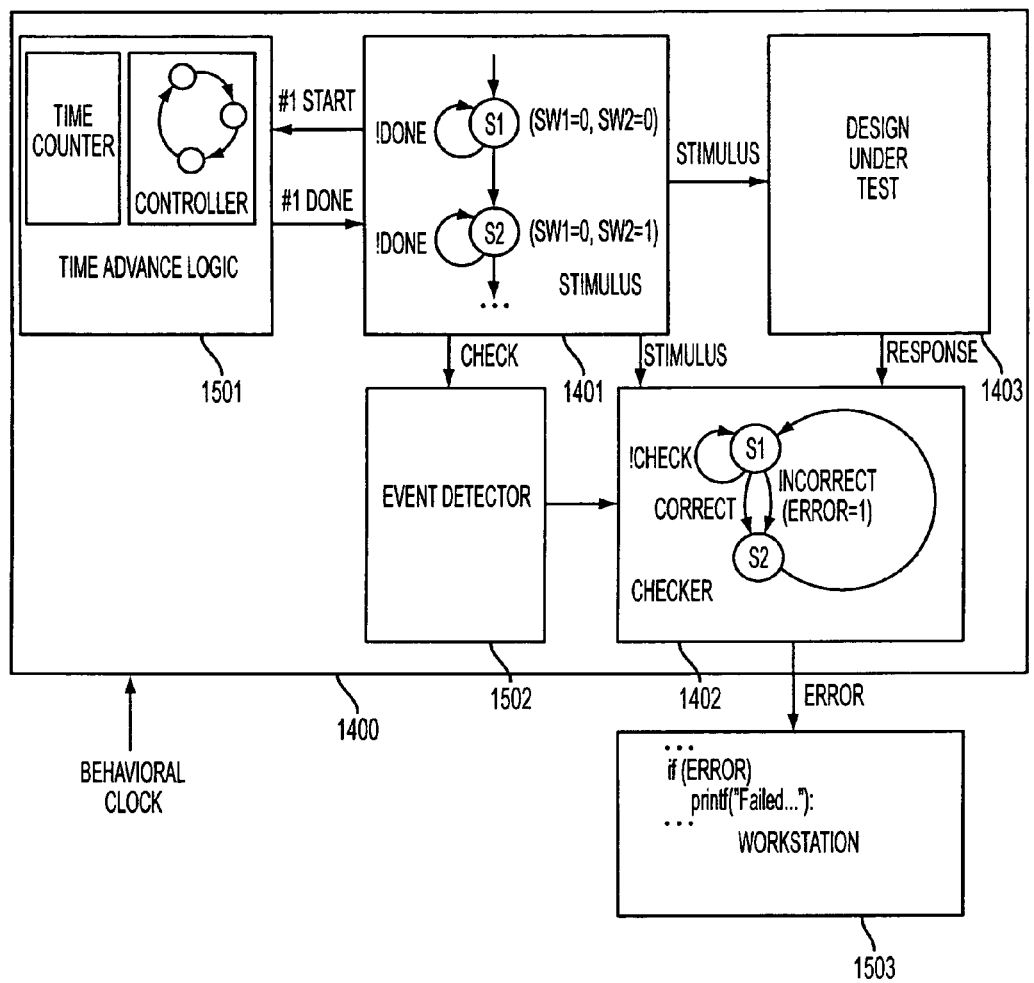
FIG. 15 is an illustrative functional block diagram of an emulation system.

Referring to FIG. 15, the stimulus generator 1401 and the checker 1402 may be implemented using finite state machines as shown. In addition, time-advance logic 1501 (which may be part of a GTAN), may be implemented. The time-advance logic 1501 provides the stimulus generator 1401 with a signal that signals completion of a unit delay (i.e., #1). In this simple example, the time-advance logic 1501 may simply be a time counter. A behavioral clock input is provided to the reconfigurable hardware platform 1400 in FIG. 15, and may be distributed to some or all of the various blocks therein. An event detector macro 1502 receives check signal that indicates whether it is time to for the checker 1402 to check the output of the DUT 1403. Also, a workstation 1503 may be coupled to the reconfigurable hardware platform 1400 for providing output, e.g., by printing, to a user when a failure occurs. In this way, the testbench can be mapped onto a reconfigurable hardware platform using a finite state machine/RTL level of abstraction running on a behavioral clock.

Timing Control Statements

The conversion of particular behavioral constructs into RTL will now be discussed. Timing control statements are commands/mechanisms that wait for an appropriate amount of simulation time to elapse. Once the condition in a timing control statement is satisfied, the wait is matured and normal flow of execution is restored. Three type of timing control statements are delay (#), wait, and event control (@). Delay statements specify the duration of time to wait for. Wait and event control statements provide mechanisms wherein execution waits until a specific change in a design signal is encountered. A wait statement matures, and thus execution resumes, only upon the condition being satisfied. An event statement matures, and thus execution resumes, only upon an appropriate change in the event expression such as the occurrence of an edge in a signal, which may be specified as a positive edge (posedge) or a negative edge (negedge). If more than one timing control statements are waiting simultaneously, then a delay statement will only mature if all of the event and wait statements at the current simulation time have matured.

FSMs may be used to implement a wait within a process. Each concurrent procedural block may be implemented as an implicit style FSM. Timing control statements/expressions may be mapped to the states in an FSM. For example, FIG. 7A, 7B and 7C show examples of wait, delay, and event control statements mapped to FSMs 701, 702, 703, respectively. In FIG. 7A, the wait statement is "always wait(in) clk=~clk." In FIG. 7B, the delay statement is "always #5 clk=~clk." In FIG. 7C, the event control statement is "always @(in) clk=~clk." The 'done' signals in FIGS. 7B and 7C are generated by the GTAN 500. In the case of the wait and event statements (FIGS. 7B, 7C), a design signal change would mature the wait. In the case of the event statement (FIG. 7C), special logic 704 may be used to detect the particular kind of change (such as edge, posedge, negedge). The GTAN 500 maintains track of all of the active delays at any point in simulation time and matures the appropriate statements at the right time.

To prevent delay statements from maturing before concurrent wait and event statements, each wait and event statement transformation may also include special logic that interfaces with the GTAN 500. This logic may generate a hold_time_adv signal to the GTAN 500, ensuring that as long as any wait/event is maturing anywhere in the system, the GTAN 500 will not advance any delays. This situation is shown in FIG. 7C.

Zero-Delay Data Dependent Loops

A zero-delay data dependent loop is a loop with a dynamic termination condition and no-timing control statements in the body of the loop. During normal software simulation cycle, zero-delay loops are executed as one single activity. Until a zero-delay loop has completed being executed, the remainder of the simulation activity is frozen, i.e., simulation time is not advanced Thus, while a zero-delay loop is being executed, neither a wait statement, a delay statement, nor an event control statement can mature. Special consideration may need to be paid to zero-delay loops since much of the activity in the system may be expected to occur in parallel. Special logic may therefore be introduced to freeze the activity until a zero-delay loop has completed. This special logic may:

stop time advance cycles and wait/event maturity, and isolate the zero-delay loop block until such time as it completes its execution, i.e. the values updated in the zero-delay loop and the values updated in the design during execution are not visible to each other.

The combination of the above two steps would achieve the objective of freezing the relevant activity in the design.

To achieve the above, data dependent zero-delay loops may be treated as being in a time stopping state of a FSM. All the variables assigned in the zero-delay loop as well as signals that the zero-delay loop reads, may be assigned to a corresponding temporary variable during execution of the zero-delay loop. When the zero-delay loop terminating condition occurs, the final values of these temporary variables may be assigned to the appropriate registers. Special logic may be added such that a zero-delay loop interfaces with the GTAN 500 and ensures that no time advance or timing control maturity occurs during execution of the zero-delay loop. For example, as shown below, a zero-delay loop may be transformed from a behavioral model (shown on the left) into an RTL model FSM:

```
                              i = 0;
                              count_tmp = count;
                              i_tmp = i;
                              sum_tmp = sum;
i = 0                         while (i_tmp<count_tmp);
while (i < count)                 begin
    begin                             i_tmp = i_tmp + 1;

i = i + 1                     sum_tmp = sum_tmp + i_tmp;
                                      @(posedge behavioral_clk);
        sum = sum + i;            end
    ...                               i=i_tmp;
    end                               sum= sum_tmp;
                                      out1 = out1_tmp;
                              ...
                              end
```

Named Events

Named events may be converted from a behavioral model to an RTL model FSM, as illustratively shown below.

```
event e1;                     reg e1; // initialized to 0
always @(posedge clk)         always @(posedge clk)
    -> e1;                        e1 = ~e1;

always @(e1)                  always
    out = in;                     begin
                                      @(e1);
                                      out = in;
                                  end
```

Hierarchical References

Verilog, for example, allows hierarchical references and access to wires and registers. During verification it may be desirable to maintain the hierarchy of the input design.

Both hierarchical reads and writes for all registers/wires/2-D arrays/memories may be implemented. Hierarchical reads are straightforward and no transformation is required (except for preserving the nets) as they generate a gate level netlist and therefore can be treated as any identifiers and compiled. Hierarchical wire assignments also do not require any transformation. Also, for hierarchical register assignments, if the assignment is from a unique scope, then no transformation is required. However, if the assignment is from other scopes (from its local scope and other scope) than a different strategy needs to be adopted. In this strategy, all the assignments may be made to a register visible in the local scope and then the same technique is applied that is used for multiple procedural assignments.

This transformation requires a pre-processing of the complete design before compilation. On a hierarchical write, a new register 'bypass_val,' for example, is created that is used to hold the new value that is being assigned. An event 'bypass_trig,' for example, is also created that is triggered whenever a hierarchical write occurs. An always block is added in the destination scope, which updates the actual register 'bypass' with 'bypass_val' based on the signal from 'bypass_trig'.

In the case of blocking assignments, all of the reads to the hierarchal registers within the assigning block refer to the local temporary register. This means that the local temporary register is updated with the actual register value after every timing control statement in the block. This need not be done for a hierarchical non-blocking write. An example of a transformation of a hierarchical reference is shown below:

and assign being active on the same register, the forced value takes precedence. Once a register is forced using a force statement, all procedural assignments on the register are skipped until the register is released again using a release statement.

Figure 12:
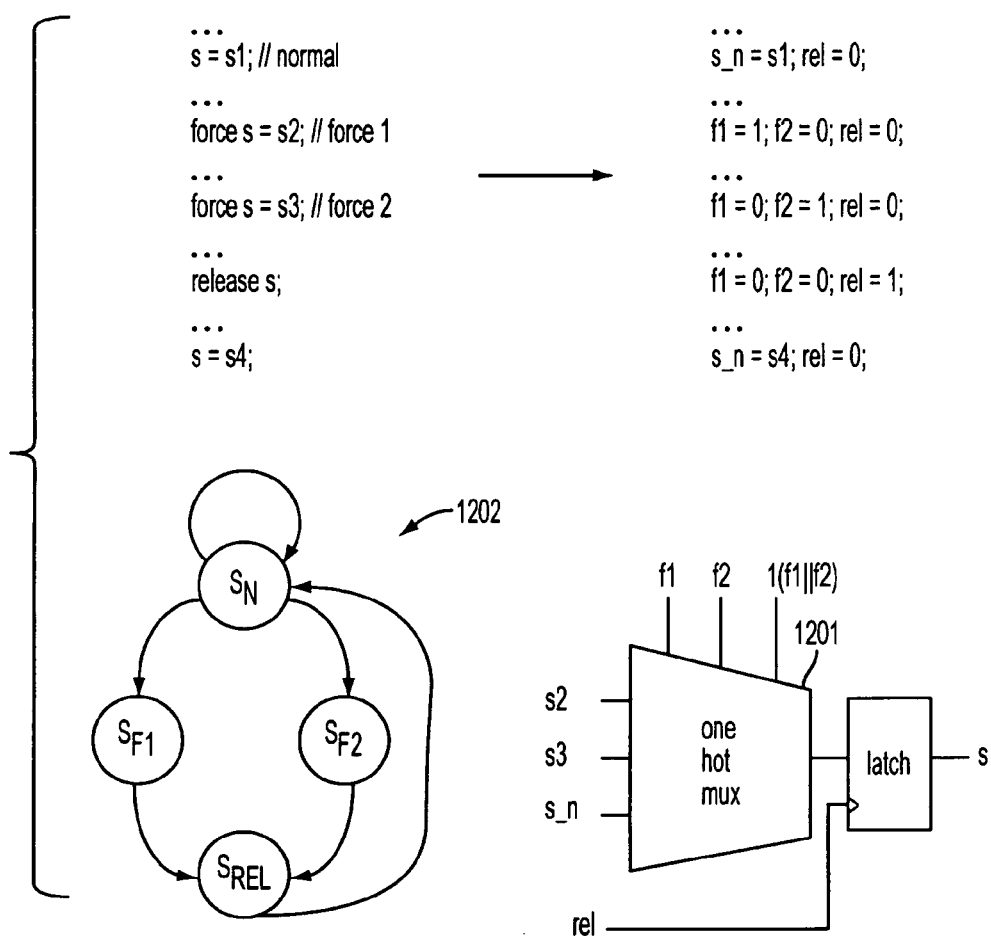
FIG. 12 is an illustrative functional block diagram showing a transformation of a force-release construct.

To compile the construct, the force-release constructs may be transformed into a multiplexer (MUX) 1201 and a controlling finite state machine (FSM) 1202 that generates various select signals for the MUX. Illustrative embodiments of the MUX 1201 and the FSM 1202 are shown in FIG. 12. Inputs to the MUX 1201 are the normally assigned values of the register and forced value of the register. A select input is asserted whenever the control flow reaches a force statement on the register. When the control reaches a release statement on the register, the FSM 1202, the FSM 1202 moves to a "released" state. When another normal assignment occurs on the register, the normal input of the MUX 1201 is updated and the select input is de-asserted. FIG. 12 illustrates the above transformation for force-release statements on a register. At any given point, the register can be in one of the three states, normally assigned (SN), forced (SF), or released (SREL). The register is initialized in the SN state. A force statement then moves the register to the SF state, and a release statement moves the register to the SREL state. At a later point, a normal assignment statement can then move the register back to the SN state. The MUX 1201 selects between the forced values and the normally assigned values depending upon the state of the register. In the release state, the latch on the MUX 1201 output, maintains the last forced value until a normal assignment takes place. For a wire, the sole difference is that the release state is not required, as in that case the normal assignment happens to be a continuous assignment which immediately takes effect.

```
module top;                          module top;
...                                  ...
middle u_middle(..);                 middle u_middle(..);
...                                  ...
always                               always
begin                                begin
   #1;                                  #1;
   ...; // 0-delay-blk1         →       reg_value = u_middle.u_bottom.reg;
   u_middle.u_bottom.reg = expr;        ...; // 0-delay-blk1
   ...; // 0-delay-blk2                 reg_value = expr;
   top_reg = u_middle.u_bottom.reg;     ->reg_event;
   ...; // 0-delay-blk3                 ...; // 0-delay-blk2
   #2;                                  top_reg = reg_value;
end                                     ...; // 0-delay-blk3
endmodule                               #2;
                                        reg_value = u_middle.u_bottom.reg;
                                     end
                                     endmodule
                                     Module bottom will have a extra block:
                                     always @(top.reg_event)
                                        reg = top.reg_value;
```

Force-Release and Procedural Assign/De-Assign

Force-release and procedural assign/de-assign constructs are semantically the same except that in case of both force The same strategy is applied for the assign-deassign construct. Below is shown an illustrative transformation of a force/release construct.

```
always @(t1 or t2)
begin
   if(t1)
   begin
      out1_value = t2;
```

```
always @(t1 or t2)                      out1_release_active = 0;
    begin                           end
        if (t1)               →     else
            out1 = t2;              begin
        else                            out1_value = ~t2;
            out1 = ~t2;                 out1_release_active = 0;
    end                             end
                                end
initial
begin                           initial
    #3 force out1 = 0;          begin
    #6 release out1;                #3 out1_force_value = 0;
end                                 out1_force_active = 1;
                                    out1_release_active = 0;
                                    #6 out1_force_active = 0;
                                    out1_release_active = 1;
                                end
                                always @((out1_release_active or
                                    out1_force_active or out1_force_value
                                    or out1_value)
                                begin
                                    out1 = out1_force_active ?
                                        out1_force_value :
                                        (out1_release_active ?
                                        out1_force_value :
                                        out1_value);
                                end
```

Fork-Join

Figure 18:
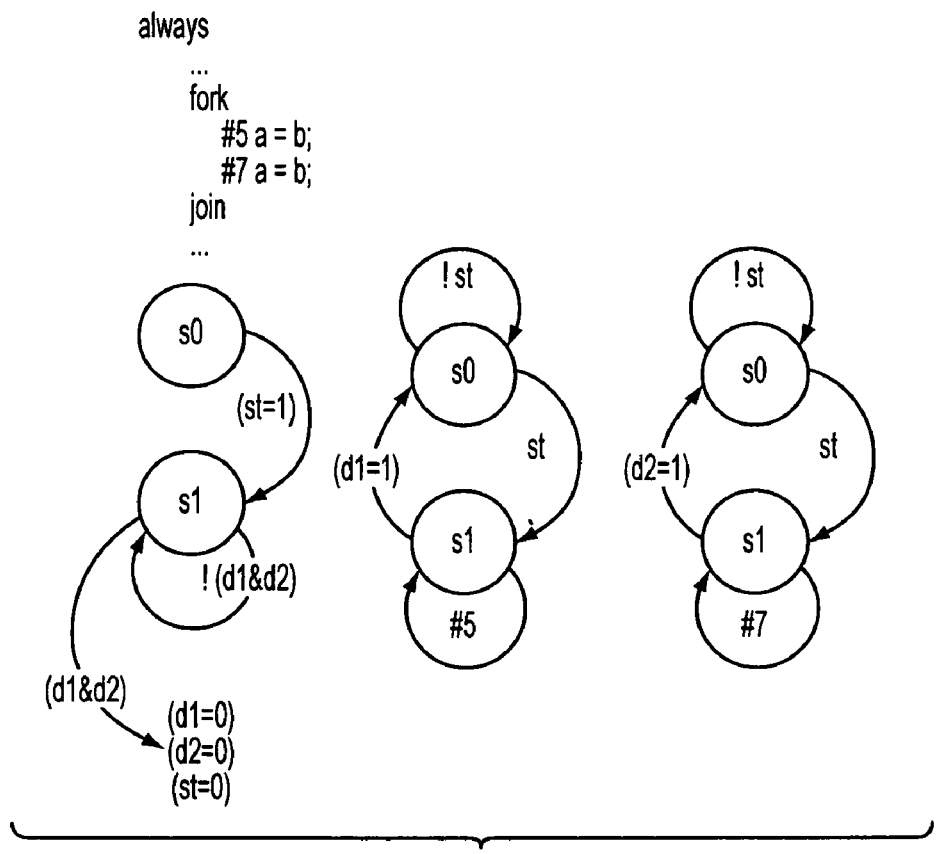
FIG. 18 is an illustrative finite state machine resulting from a transformation of a fork-join statement.

A fork-join block is converted into a structural FSM where each branch of the fork-join statement represents one of a parallel set of child FSMs. The child FSMs wait for an enable to be asserted in their start state and indicate their completion to the parent FSM. The parent FSM asserts the enable simultaneously to all of the child FSMs when the control flow reaches the fork-join statement. The parent FSM then waits for the end state of each child FSM associated with a branch of the statement. Below and in FIG. 18 are shown an illustrative transformation in accordance with the principles just discussed.

```
always                  always
                        begin
    begin                   ...
        ...                 start_branches = 1;
        fork                @posedge BHVCLOCK;
        #5 a = b;           while (!br1_end || !br2_end)
                      →
        #7 b = c;               @posedge BHVCLK;
        join                ...
        ...             end
    end
                        always
                        begin
                        always
                        begin
                            while (!start_branches)
                            @posedge BHVCLK;
                            br!_end = 0;
                            // Consume #5 (make delay contribution
                            // from this block as 5 units)
                            a = b;
                            br1_end = 1;
                        end
                        always
                        begin
                            // Similar code for branch 2
                        end
```

Behavioral Tasks and Functions

Figure 19:
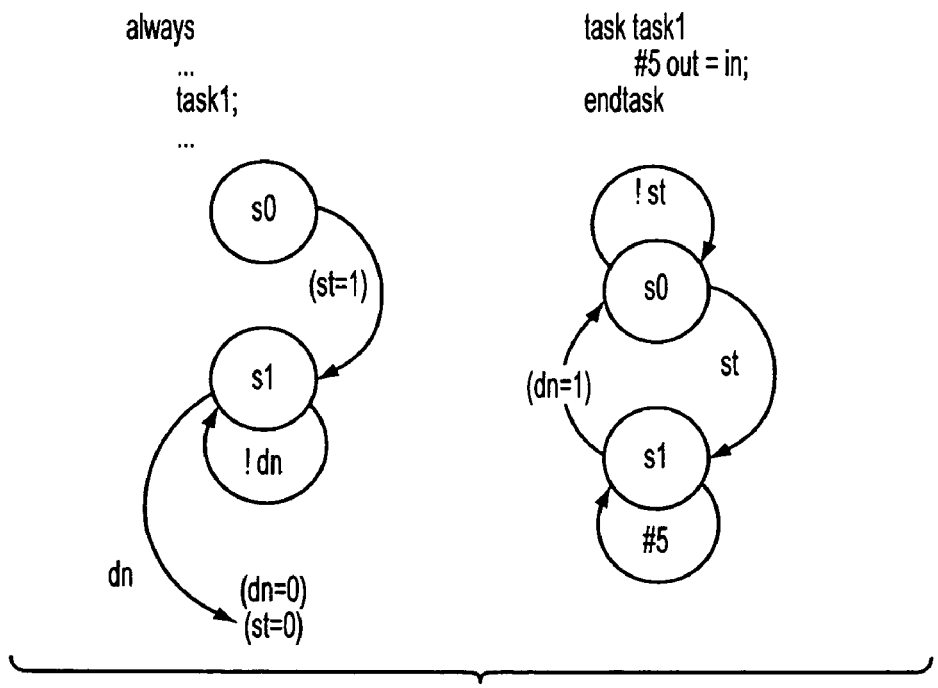
FIG. 19 is an illustrative finite state machine resulting from a transformation of a behavioral task/function.

Behavioral tasks are defined as those tasks that require time advance within such tasks or that have data-dependent zero delay loops. Behavioral tasks and functions may require one or more behavioral clock cycles to execute and need to be transformed into FSMs. The compilation process for behavioral tasks and functions is similar to fork-join, where body of the task/function is converted into a FSM. This FSM is triggered from the parent FSM, when the control flow reaches the task/function invocation call, as shown for example in FIG. 19.

Inter-Block Disable Statements

Figure 20:
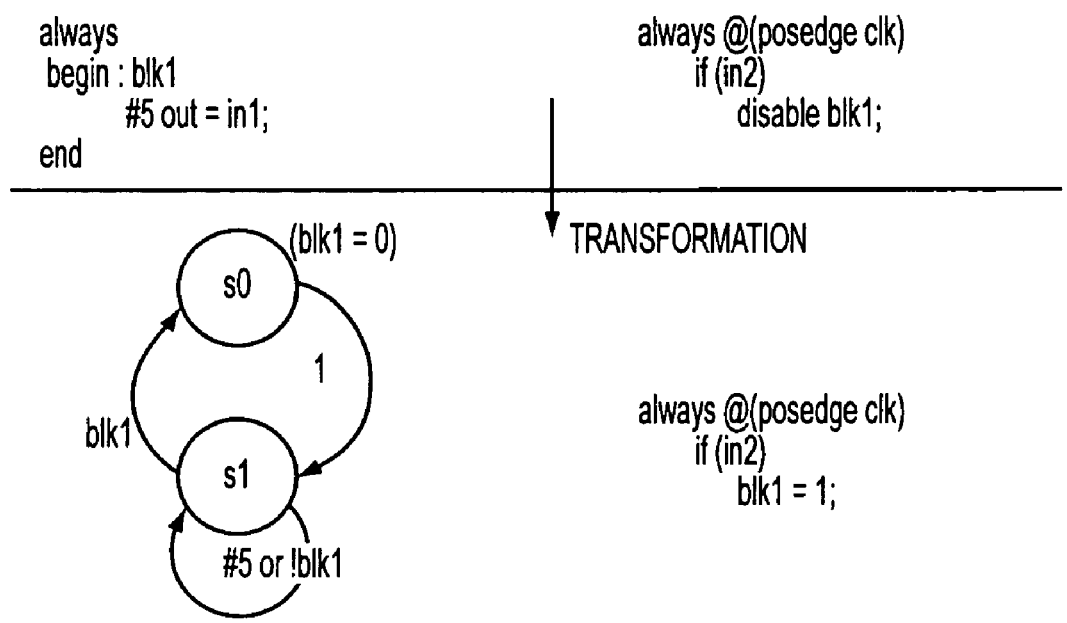
FIG. 20 is an illustrative finite state machine resulting from a transformation of an inter-block disable.

Disabling from within a respective named block is common and is part of RTL synthesis. However, special transformations need to be implemented for handling inter-block disables. For compilation of inter-block disable statements all the named blocks which may be disabled are identified. For each such block, conditional disables are added in all user states within the block. The condition depends on the assertion of a special signal by the block enforcing the disable. A similar strategy may be adopted for those tasks that may be disabled by other blocks. This strategy is illustrated in FIG. 20.

Non-Blocking Assignments

Non-blocking procedural assignments do not block the execution flow for their completion. While handling a non-blocking assignment, the value to be assigned is set aside. After all the blocking assignments as well as all event/wait statements in the current simulation cycle have been completed/matured, this value is assigned to the target register(s). After this assignment, if new events/waits are to be matured they will be matured and new simulation cycle will start. As long as there are these simulation cycles, time cannot advance.

Figure 16:
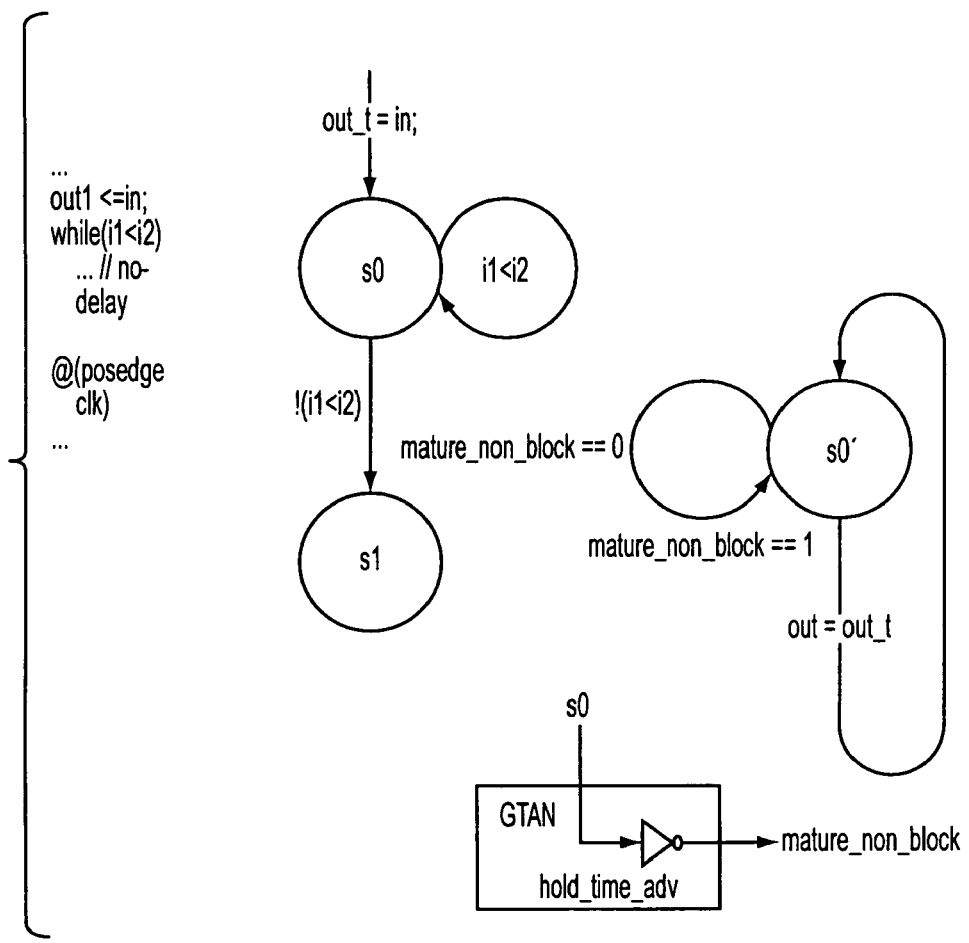
FIG. 16 is an illustrative representation of a finite state machine for managing non-blocking assignment.

For non-blocking assignments in the behavioral modules, extra time stopping states are inserted. Non-blocking assignments are suspended until the GTAN 500 is ready to advance simulation time based on the control flow. Deferred values of non-blockingly-assigned signals are stored in temporary registers. The temporary values are assigned to the actual register just before the next simulation cycle. This is illustratively shown in FIG. 16, and may be implemented by creating a temporary register for each register that has been assigned non-blockingly. The temporary registers hold any values scheduled to be assigned to the associated registers. Any non-blocking assignment to a register would thus actually immediately assign to its associated temporary register to keep the value to be assigned. Special logic is maintained by the GTAN 500 to keep track of exactly when to mature all non-blocking assignments.

When there are no event/wait statements maturing in the system anywhere, the GTAN 500 asserts a special signal mature_non_block. Each non-blockingly assigned register has special driving logic for it that keeps the register's value unchanged until this special signal is asserted after which it assigns the relevant temporary onto the register. Thus, after the assertion of this signal all non-blocking assignments pending in the current cycle are matured. At this point the GTAN 500 would again check if there are event/wait that need to be matured in the system. If not, the GTAN 500 will advance simulation time to the next simulation cycle.

$time and Time Variables

Each time variable may be converted into a 64-bit (or other size) register. Since the GTAN FSM maintains the simulation time, $time is also available to the user. However, if there are many time variables and arithmetic operations on these variables, there may be significant compile time and a gate count penalty.

Multiple Driver Resolution

In case a register has multiple procedural assignments on it, the Verilog semantic is to use the last assigned value. This occurs irrespective of whether the different assignments were from the same procedural block or not. Although the use of multiple assignments on a register is rare in RTL designs, it is often used in testbenches. Where the assignment comes from multiple blocks at different simulation times, then the simulation results are well defined and are un-ambiguous. However, if these assignments occur during the same simulation time, then the simulation results would be ambiguous because the order in which the two assignments would be executed would not be defined. In this situation, special logic may be used to take care of such situations.

Figure 8A:
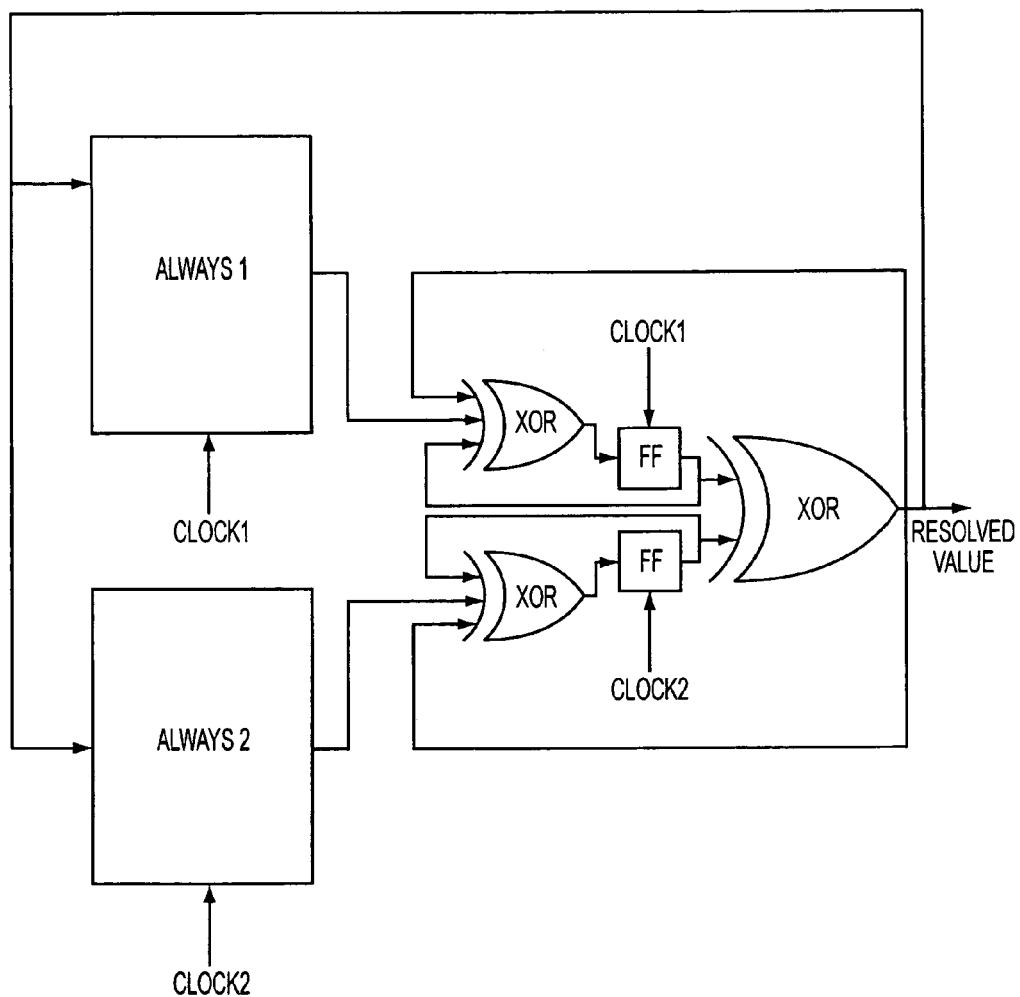
FIG. 8A is a schematic of a multiple driver resolution circuit using flip flops and XOR gates.

Traditionally, RTL synthesis tools have attempted to solve some special cases of this problem by using a special macro model using flip flops and XOR gates that can use two clocks and two data inputs and provide one output (hereinafter referred to as multi-clock macro), as shown for example in FIG. 8A. The behavior of this multi-clock macro is such that it can transfer data to the output when the associated clock arrives. And example of a multi-clock macro that can handle multiple procedural assignments is shown below.

```
always @(posedge clk1)
begin
    if(C1) register = in1;
end
always @(posedge clk2)
begin
    if(c2) register = in2;
end
```

A limitation with this approach is that it does not adequately handle cases where the two clock signals arrive at the same time, which may happen if the two clock signals are from the same clock. The results may not necessarily be ambiguous, however, because the two conditions $c1$, $c2$ may not be active at the same time.

Thus, newer techniques may be needed to solve the problem in general. These techniques may be employed at the back-end stages of the transformation where all processes have already been converted into CDFGs and then are being allocated into gates. The advantage of doing this is that no pre-processing is required before CDFG creation for such registers. The typical cases in multiple assignments are explained as follows.

CASE 1: two synchronous processes using different clocks. This case may be resolved using the multi-clock macro discussed above.

Figure 8B:
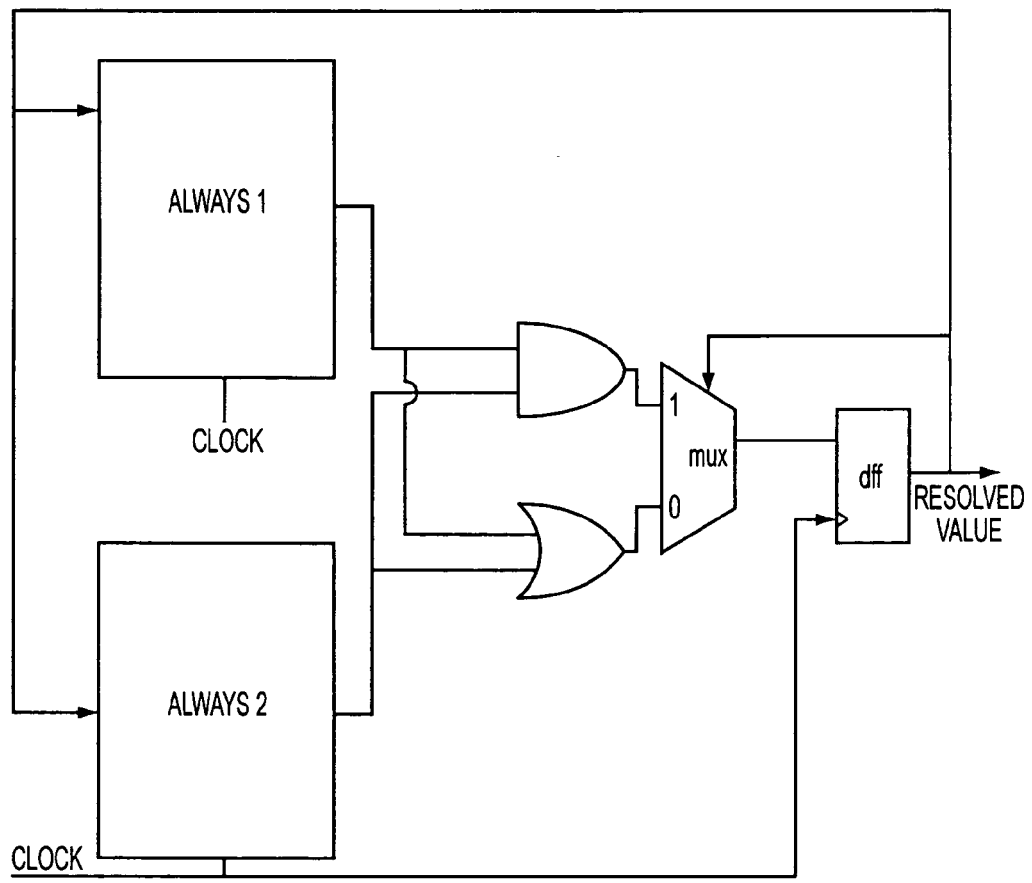
FIG. 8B is a schematic of an illustrative multiple driver resolution circuit.

CASE 2: two synchronous processes using same clock. As discussed earlier, such cases are un-ambiguous only if the assignments don't occur at the same simulation time. Thus, a special circuit may be used that produces correct results when the assignments are mutually exclusive in time. To explain the circuit, every process assumes that it is the only driver for a register and sends out the next cycle value for that register to a flip flop. In case there are two such processes, two next cycle values are being sent to this circuit. The circuit chooses the value that is different from the current value of the register. This works because if the next value is different from the current one it has to be due to an assignment from that process. FIG. 8B illustrates this arrangement.

CASE 3: two non-RTL processes. Recall that non-RTL processes are nothing but RTL processes synchronous with the behavioral clock. Thus, the solution applied to CASE 2 works in this case as well.

Zero Delay Cycles

In Verilog, special meaning has been assigned to the #0 statement (i.e., a zero delay cycles statement). Assignments that are scheduled non-blockingly cannot mature at #0. Thus, a #0 statement is a special zero delay cycle, which is similar to blocking zero delay cycles.

During a #0, the global minimum time advance may take a zero value. For this reason, a non-blocking maturity global signal also depends on the global minimum being non-zero to assert itself, thus ensuring that non-blocking zero delay cycles are deferred when #0 is being executed.

System Tasks/Functions

As mentioned earlier, system tasks/functions are implemented as remote procedural calls. The actual execution of these tasks may take place in the workstation 204. The procedural blocks view the system task call as any other behavioral task call. During such calls, all the activity in hardware may be suspended. A SCE-MI compliant transport mechanism may be used to enable these tasks. Special transactors (e.g., HDL at the reconfigurable hardware platform 201, and C at the workstation 204) may be created for both sides of the communication. These transactors may be broadly classified into two categories:

a) Tasks that do not return any values to the HDL side may be classified as one-way task or non-blocking tasks. HDL side execution need not wait for such tasks, as they are only messages to the workstation. These tasks require a single transaction to be sent from the HDL side to the C side. Examples of such tasks are display tasks ($display, $write etc).

b) Tasks that return values (such as $random, $fopen) may be classified as two-way tasks or blocking tasks. The HDL process that makes a blocking task call waits for its return before it resumes execution. Furthermore, such tasks use two transactions, one from the HDL side to the C side and the other from the C side to the HDL side that fetches the return values.

FIGS. 9 and 10 depict examples of one-way and two-way system tasks, respectively.

FIG. 11 illustrates an example of the system tasks infrastructure. On the reconfigurable hardware platform 201, an HDL transactor 1101 is coupled to all of the system tasks of the design 1102. At any point, the design 1102 can activate one or more system tasks. The HDL transactor 1001 uses an optimized queuing logic and sends tasks in series to the workstation 204. A C dispatcher receives these tasks and calls appropriate C functions. For example, a $display results in a printf ( ), whereas $random first generates a random number and then sends it back to the emulator. A call to a $random from the design 1102 puts the HDL transactor 1101 in the blocking state. Note that the transactor 1102 also controls the bhvclk input to the design 1102, and in its blocking state, the HDL transactor 1101 disables the design 1102. When a random number is received from the C side, the HDL transactor 1101 releases the blocking state and enables the bhvclk input.

Figure 17:
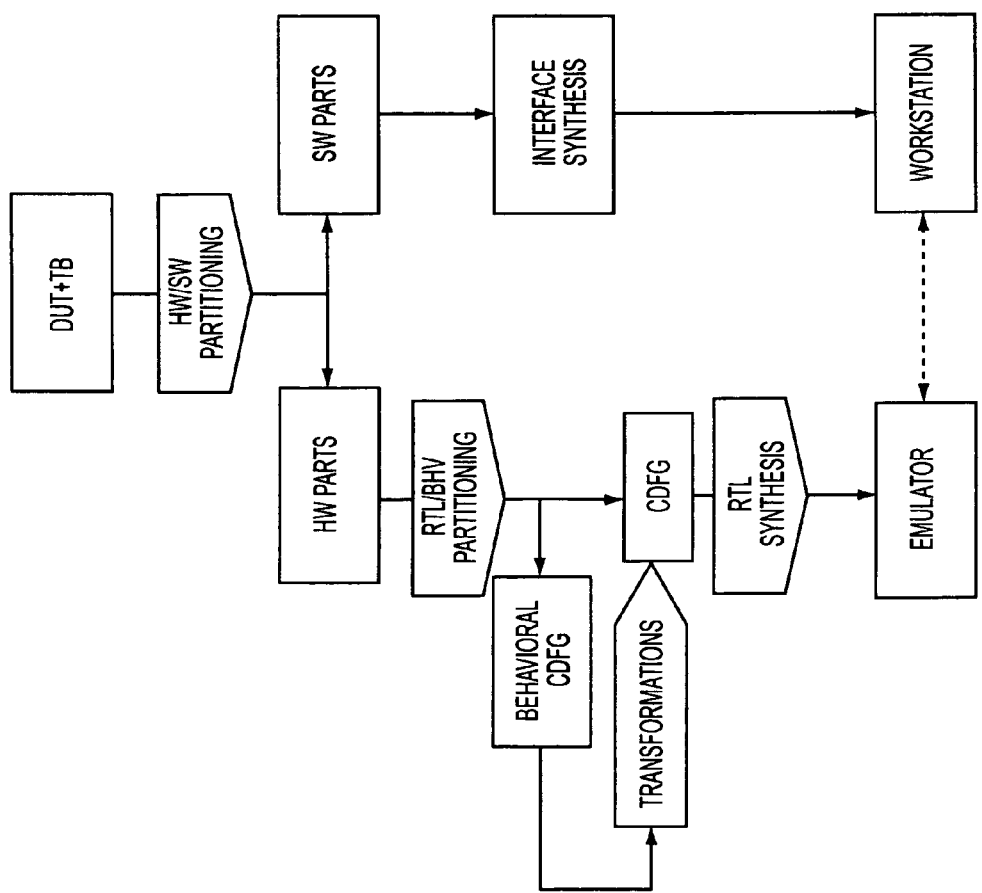
FIG. 17 is an illustrative functional block diagram of a system.

Up to now it has been described at a conceptual level how behavioral HDL is transformed into an intermediate RTL representation. An illustrative system that implements the transformations described previously may be created as shown in FIG. 17. Such a system takes the DUT (described in RTL HDL) and the testbench (described in behavioral HDL) and partitions the DUT into portions that need to execute on the emulator and portions that execute on the workstation. For the portions that execute on the emulator, the transformations described so far may be used to convert the behavioral HDL into an intermediate RTL representation. This RTL representation is known as the Control Data Flow Graph (CDFG) in traditional RTL synthesis tools. The conversion involves an intermediate representation known as Behavioral Control Data Flow Graph which then may be converted into the CDFG. The RTL portions of the design may be directly converted into CDFG. This combined CDFG may then be taken through traditional RTL synthesis process and converted into emulation netlist. At this point, interface synthesis (transformations for the system tasks that require dynamic support from workstation) may be performed, and the interfaces for the two sides may be created that enables the communication between the workstation and the emulator when the design is simulated.

2.0 Modeling Constructs

The modeling concepts described in this section apply to all HALs, such as but not limited to Verisity 'e', Vera, C, C++, and SystemC. For purposes of explanation only, the languages C, C++, and SystemC will be specifically referred to in non-limiting illustrative embodiments. It is to be understood, however, that such references are intended to include other HALs.

2.1 HAL-to-HDL Functions

Figure 22:
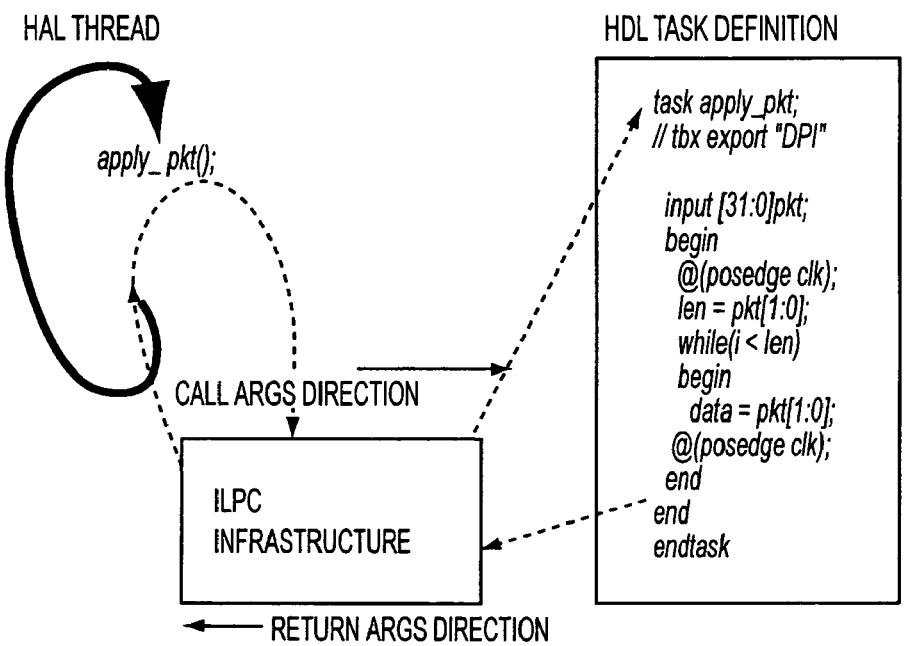
FIG. 22 is a functional block diagram of an illustrative exported task (HAL-to-HDL) in which an HDL task is invoked from the HAL domain.

HAL-to-HDL types of functions are defined in the HDL side either as tasks or functions. However, these may be called directly from code on the HAL domain to perform an operation on the HDL domain. This operation on the HDL domain may consume non-zero simulation time, while on the HAL domain the calling thread will wait for the function call to return. In such a case, the semantics on the HAL domain are structured as if the call is executed in the HAL domain, while the call is actually executed on the HDL domain and returned transparently to the HAL domain. Procedural call arguments may be converted to native data types as needed for each of the HAL and HDL domains as they are passed back and forth. These HAL-to-HDL functions/tasks may be useful in order to configure the timed portion of the testbench to perform a particular test, such as to set, force, or query certain signal values from the DUT and the timed portion of the testbench, or to run a complete test by invoking a time-consuming task on the HDL domain. FIG. 22 shows an example of an HAL-to-HDL call.

Such procedural calls are also known as exported functions or exported tasks. Exported functions do not consume simulation time, while exported tasks may consume non-zero simulation time. Communication between the HAL and HDL domains may occur via procedural call arguments. Such communication also allows for a unique use model, wherein the main driving thread of the simulation is controlled from the HAL domain, thereby providing a simpler software-centric use model.

2.2 HDL-to-HAL Procedural Call

An HDL-to-HAL procedural call may be initiated from the HDL domain but executed at the HAL domain. During execution, the HDL domain may call a procedure (such as in C), and the HDL domain would be suspended while the procedure is executed on the HAL domain. The procedural call on the HAL domain may consume non-zero simulation time, but simulation advance on the HDL domain would be stopped until either the procedural call returns to the HDL domain or itself calls an exported task and/or function. If an exported task or function is called from this HDL-to-HAL procedural call, then the calling thread on the HDL domain would be suspended until the HDL-to-HAL procedure call itself returns.

Figure 23:
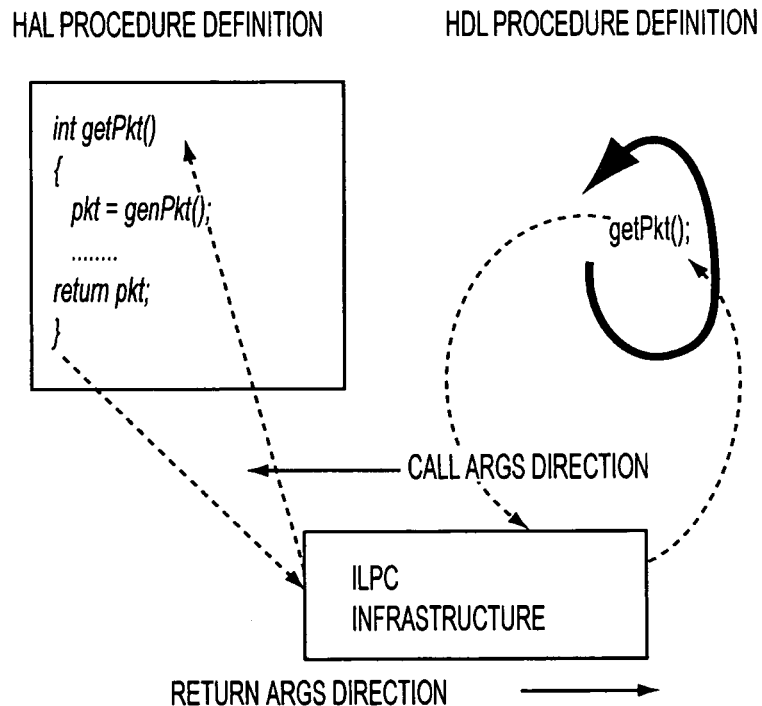
FIG. 23 is a functional block diagram showing an illustrative imported task/function (HDL-to-HAL call) in which a HAL function is invoked from the HDL domain.

This operational mechanism differs from the Verilog PLI call in that only the procedural arguments are accessible for reading and writing from the procedure executed on the HAL domain. This difference allows for models to be optimized. In addition, this operational mechanism makes it easier to code than with conventional PLI models, since there are no special application programming interfaces (APIs) for the user to learn. The procedural call on the HAL domain may also consume time by calling HAL-to-HDL procedural calls (which do consume time). FIG. 23 shows an example of an HDL-to-HAL call.

Such procedural calls are also referred to as imported tasks and functions. An imported task may consume non-zero simulation time, while an imported function may not consume any simulation time at all (i.e., they return in zero simulation time). Imported functions may call exported functions, and imported tasks may call exported tasks or functions as desired by the application. Similarly, exported functions may call imported functions to execute an operation on the HAL domain, and exported tasks may call imported tasks or functions to execute an operation on the HAL domain. Thus, a chain of events may be created wherein an imported task calls an exported task, which in turn may call another imported task, and so on. This chain of events may not be statically determinable at compilation time, as opposed to a pure HDL system that calls only HDL tasks and functions.

This modeling paradigm also allows for a given task to be disabled (i.e., stopped) immediately using the Verilog HDL construct "disable" instruction from the HDL domain. In such a case, semantics require that the entire chain of imported and exported tasks be disabled with immediate effect before advancing simulation time.

3.0 Optimizations

3.1 Transaction Pipes

HDL-to-HAL and HAL-to-HDL procedural calls are blocking in nature, in the sense that the initiator of a call is blocked while the call is executed at the other domain. However, transaction pipes are non-blocking in nature, in the sense that transaction pipes facilitate asynchronous one-way message passing between the HAL and HDL domains. Transaction pipe procedures may be implicitly defined by the system and may be called at both the HDL and HAL domains to send and receive data to and from a transaction pipe. This is conceptually similar to UNIX pipes that are used to send data across two processes. Transaction pipes are useful in modeling streaming systems wherein the HAL and HDL domains can run decoupled from each other while asynchronously passing data back and forth to each other. This allows the HDL and HAL domains to execute concurrently until synchronization is required. Performance is greatly improved by providing for such concurrent execution.

For a transaction pipe, it may be assumed and/or required that data in a transaction pipe will eventually reach the receiver. It may further be assumed and/or required that data in a transaction pipe will be received by the receiver in the same order as was sent by the sender. However, immediate receipt of data sent through a transaction pipe is neither expected nor guaranteed at the receiver end.

Figure 24:
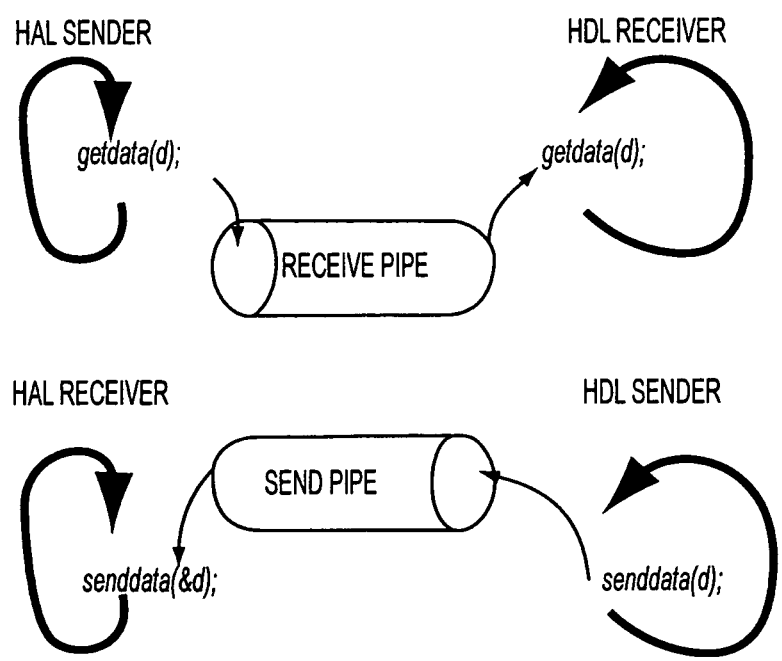
FIG. 24 is a functional block diagram of an illustrative streaming system modeled using transaction pipes.

System Verilog DPI does not include transaction pipe constructs but may be used in aspects of the present invention to achieve increased performance by de-coupling the HDL and HAL sides so that both the sides can run concurrently. FIG. 24 shows an example of a streaming system modeled using transaction pipes.

3.2 Optimal BeHaVioral Modeling Abstraction (OBHV)

As previously discussed, a potential advantage of aspects of the present invention is that a fast co-emulation verification environment may be achieved, with an additional advantage that being that the environment may be as easy to use as simple behavioral Verilog. With the use of the testbench compilation technology described herein, all of the behavioral Verilog for the testbench is transformed into gates and mapped onto the emulator, and only the inter-language function calls (HAL-to-HDL and HDL-to-HAL) are executed on the workstation.

These inter-language function calls may be user-defined and may provide the building blocks for creating a transaction level testbench. The transaction level testbench has a two-pronged advantage. First, it has an improved structure. Second, the communication between the software-based workstation and the hardware emulator is in the form of a reduced number of transactions that allow the emulator to run longer in between such transactions (i.e., free run periods), thereby accelerating overall verification.

In a well-designed transaction level testbench, these free run periods in the emulator would be a significant part of the overall verification. However, the efficiency at which these parts run depends on the behaviorally-compiled netlist, and although the use of arbitrary Verilog constructs with guaranteed simulation semantics allows for a simplified and flexible modeling paradigm, it also allows performance-reducing modeling elements to creep into the testbench. Such elements are mostly behavioral constructs with quirky simulation semantics that are difficult to automatically optimize. Some of these elements also have global relationships among one another, wherein the presence of one of the elements necessitates the inclusion of another one of the elements. The performance-reducing elements include dynamic sensitivity to arbitrary clocks and/or events, scheduling of non-blocking assignments after zero-time activity, and behavioral constructs that require FSMs modeled on the behavioral clock, as previously discussed herein in Section 1.0.

As to the dynamic sensitivity element, if a behavioral FSM is awaiting an arbitrary clock/event to occur, the FSM can only complete the wait one behavioral clock cycle after the event/clock has occurred. Furthermore, processes sensitive to clocks that make imported/exported task/function calls need to be modeled as behavioral FSMs so that the processes can introduce a series of zero-time cycles while the system awaits the function calls to return. Accordingly, they incur the extra cycle due to dynamic sensitivity even when the imported/exported tasks/functions are not being called.

As to the scheduling of non-blocking assignments after zero-time activity, if the system allows for zero-time activity (i.e., a series of behavioral clock cycles that do not advance simulation time), then all non-blocking assignments in the system are held until the zero-time activity is over and completed in a separate behavioral clock cycle before the time advance cycle. Thus, non-blocking assignments may require an extra behavioral clock cycle.

As to behavioral constructs that require FSMs modeled on the behavioral clock, these are typically sub-optimal because they can lead to zero-time activity, thus requiring the scheduling of non-blocking assignments after zero-time activity. Zero-time activity itself expends behavioral clock cycles. This results in more behavioral clock counts than user clock counts during pure HDL execution and is less optimal than the otherwise desired 1:1 ratio between the user clock count and behavioral clock count.

The OBHV modeling style has been introduced herein to provide a way to model a system that has the flexibility of inter-language functions to model transactions but is devoid of, or at least reduces the number of, performance-reducing behavioral elements. In doing so, static sensitivity to clocks should be provided. This means that a process waiting for a clock knows, a priori, when a clock edge is going to arrive and has already obtained the results of any inter-language function calls that it needs for that upcoming clock edge. However, this means that (a) there should be a way to predict clock edge arrival at least one behavioral clock cycle before it arrives, (b) there should be a way to ensure that if the clock edge is going to arrive within the next behavioral clock cycle, the associated process will make an inter-language procedure call (ILPC), also known as an inter-language function call (ILFC), (c) there should be a way to stop the generation of all clocks in the system one behavioral clock cycle before the clock edge occurs, and (d) a serialization mechanism is needed that takes ILFC calls from one process and sends them, one by one, to the workstation. This serialization mechanism dispatches the calls in execution order. When both (a) and (b) occur for a process, then (c) may be used to stop clocks, and at the same time the various ILFCs may be serialized through the serialization mechanism. Once they are all complete, the clocks may be resumed.

The OBHV modeling style may further provide for the compiler to check and flag behavioral constructs. This ensures that no behavioral constructs requiring FSMs modeled on the behavioral clock are allowed, and hence there is no zero-time activity in the system apart from ILFCs. This means that scheduling of non-blocking assignments after zero-time activity is also not required, because the zero-time activity due to ILFCs precedes any design activity (in this case, clocks), and hence the non-blocking assignments are automatically deferred.

4.0 Migration of Existing Testbenches to the New Modeling Paradigm

Using the modeling constructs described previously, a variety of existing testbench styles may be converted with minimal time and effort. For example, in the case of a Verilog testbench with PLIs, most PLIs may be converted into imported function calls. The resulting code is much simpler since there are no PLI-like APIs. In the case of a System-based software centric testbench, untimed SystemC models may be coupled to timed HDL models through the use of imported and exported tasks or functions as well as transaction pipes. In the case of a TestBuilder transaction-based testbench using the Testbench Verification Model (TVM), TVM calls may be directly converted to C-to-HDL time-consuming procedure calls. Also, the TVM body may be converted to a behavioral Verilog task that may be compiled into the emulator. Or, for example, in the case of a Verisity 'e' transaction-based testbench using Time Consuming Methods (TCMs), TCMs may be converted in a manner similar to TestBuilder TVMs. The TCM body may be converted to a behavioral Verilog task that may be called from 'e,' similar to a C-to-HDL call.

5.0 Synthesis of Remote Procedural Calls

To maximize the performance, the HDL portion of the testbench along with the DUT may further be synthesized and executed on an emulator/hardware accelerator to run all the concurrent blocks in parallel. The untimed portion, being algorithmic and computationally intensive, is executed as software on the workstation, which may run at GHz speeds. Portions of this disclosure describe synthesis technology that enables synthesis of the above-discussed modeling constructs. Such synthesis technology combines with behavioral testbench compilation technology to extend the modeling abstraction level of the transactor to the behavioral level, with the use of the C language (or other HAL).

5.1 Testbench Compilation

As previously discussed in Section 1.0, the behavioral HDL description can be viewed as a set of concurrent blocks and signals. Each block has a set of sequential statements that access the signals and change their values. Normally, this activity is asynchronous with respect to the design clock. However, testbench compilation transforms the asynchronous system into a synchronous one by introducing a new clock, referred to herein as the behavioral clock. Testbench compilation essentially implements a design-specific simulator inside the emulator. All simulation activities (e.g., signal value changes, time advance, zero delay execution) are synchronized to the edges of the behavioral clock. Extra logic for the simulation infrastructure is introduced during synthesis. The resulting system runs FSMs for each block in the original description concurrently with a global FSM that controls time advance of the overall system. The global FSM is referred to herein as the time advance network, which is described herein in Section 1.0. The only external input required for such a system is the behavioral clock.

5.2 Interface Synthesis

Figure 25:
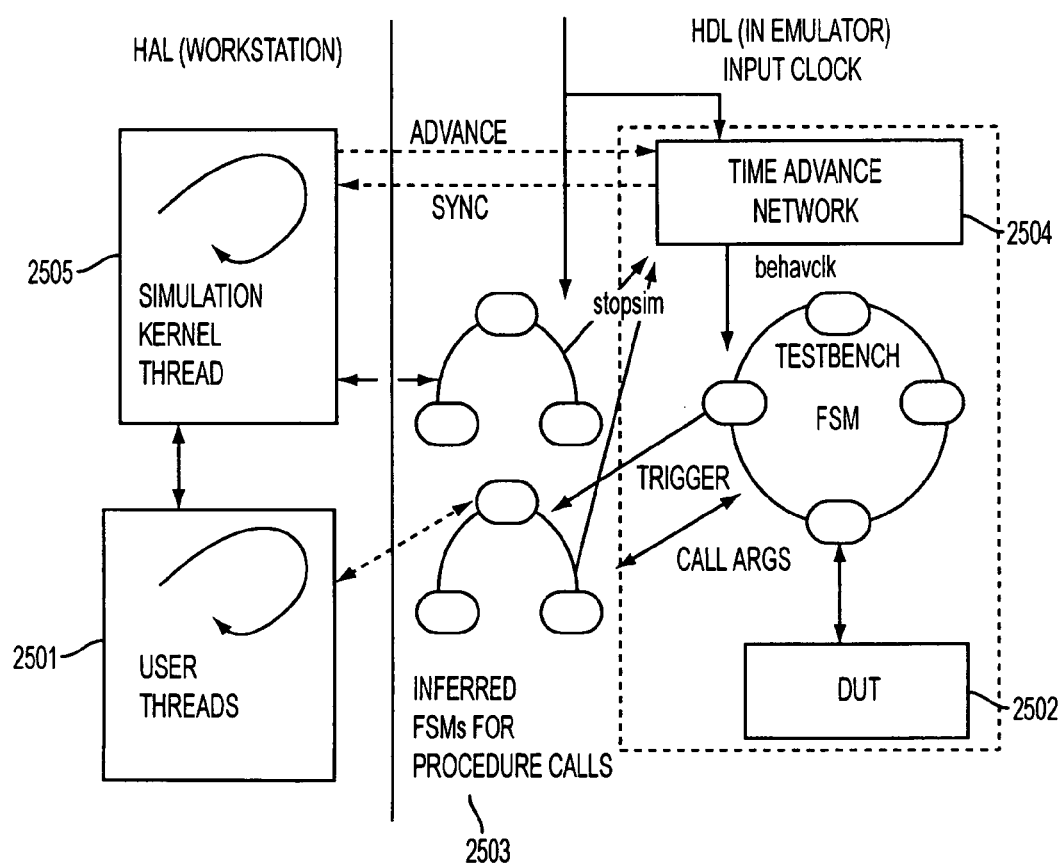
FIG. 25 is a functional block diagram of an illustrative system with inferred finite state machines that facilitate communication between the HDL and HAL domains.

The interface synthesis of procedural calls further augments the Testbench Synthesis synthesized infrastructure and infers a FSM for each HDL-to-HAL and HAL-to-HDL procedural call. The FSMs run on the free-running uncontrolled clock and are triggered from the initiating side (either the HDL or HAL domains). The FSMs synchronize with the time advance network to control time advance and to maintain procedural call semantics. FIG. 25 shows an example of inferred FSMs 2503 and their interactions with the remainder of the system. The shaded portions (i.e., user threads 2501 and DUT 2502) in FIG. 25 represent user code that has been transformed. The remaining portions are inferred design infrastructure. Since interface synthesis builds the infrastructure over the testbench compilation infrastructure, such synthesis can co-exist with other behavioral HDL models with no HAL assist within the same system.

Figure 38:
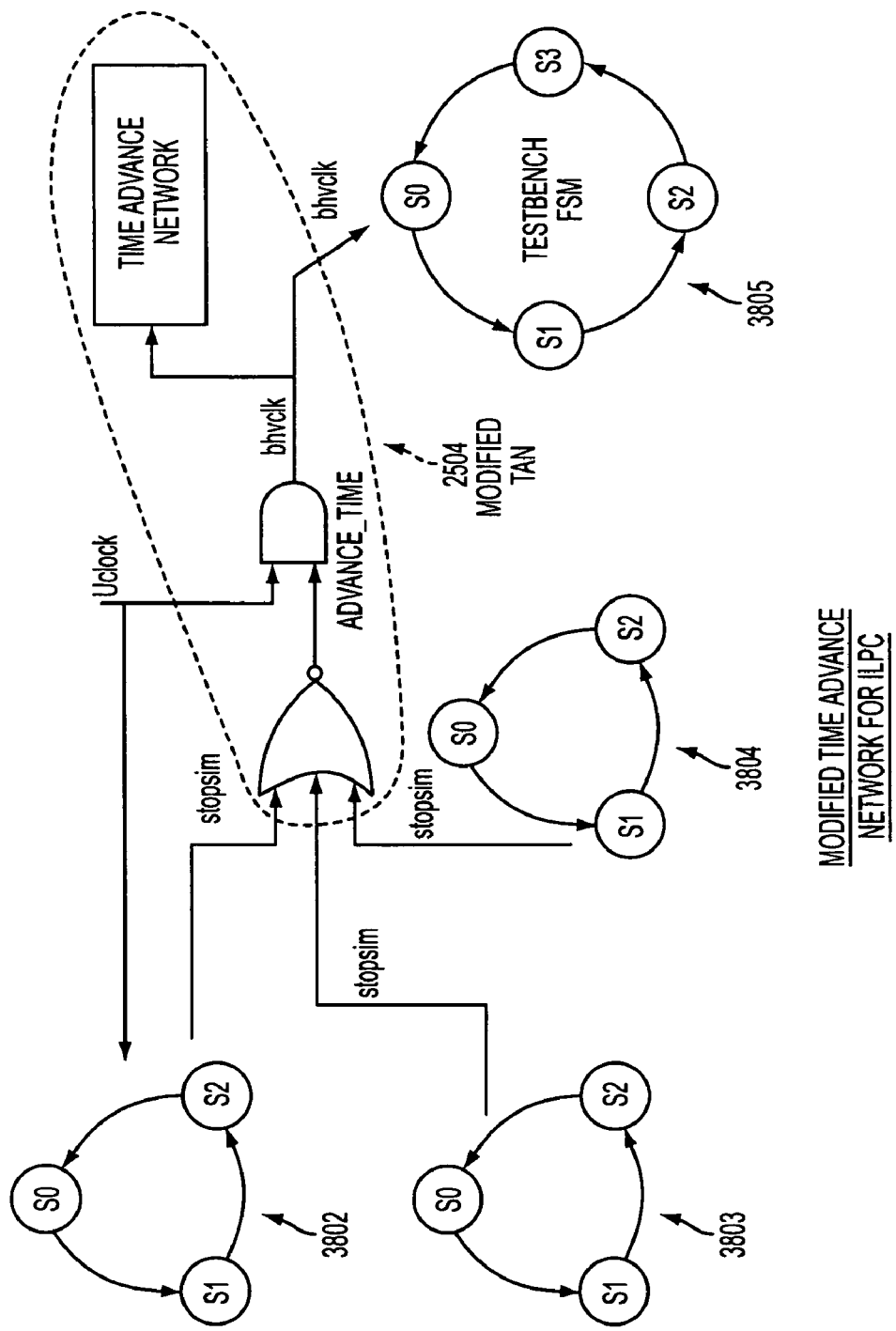
FIG. 38 is a schematic and functional block diagram of an illustrative modified time advance network (MTAN), and its environment, for ILPCs.
Figure 39:
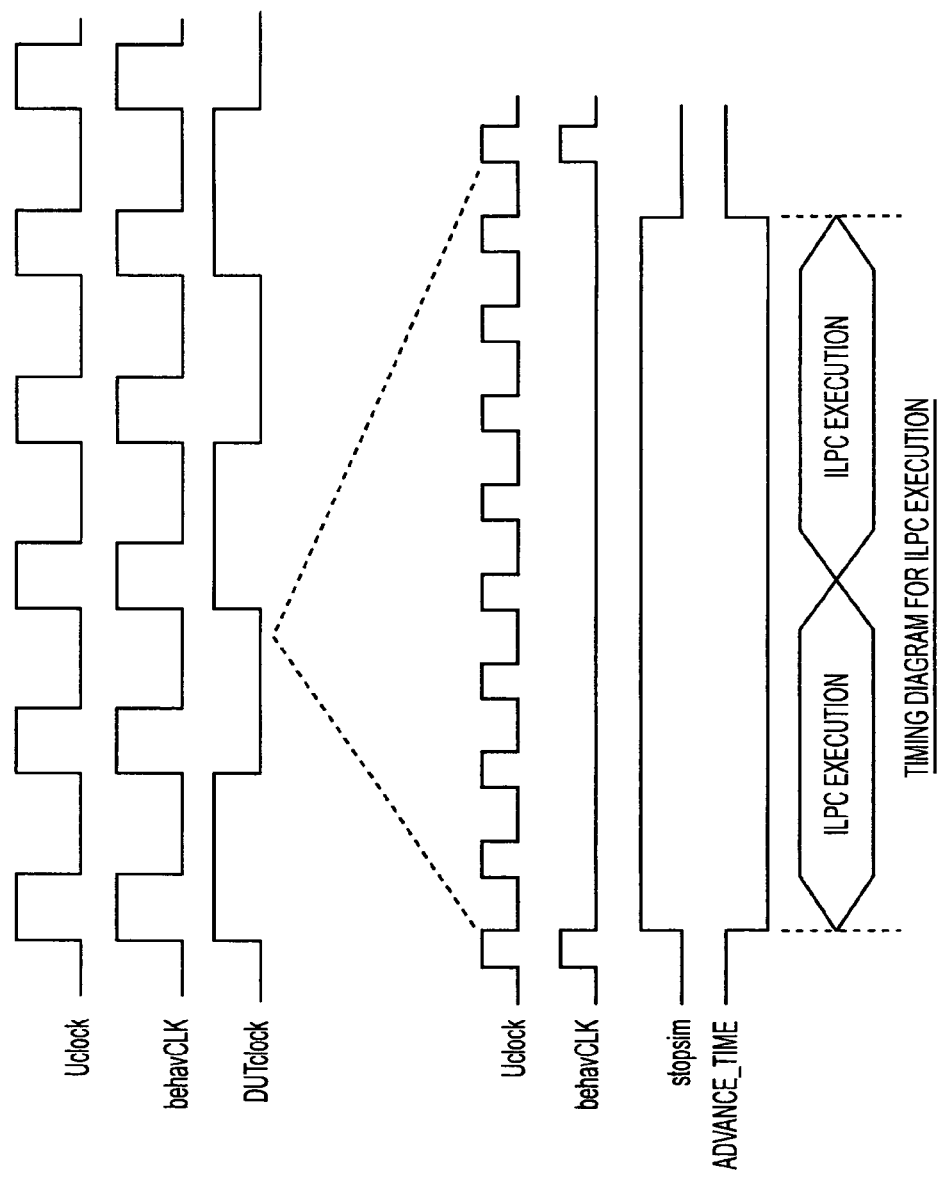
FIG. 39 is a timing diagram of an illustrative sequencing of ILPC call dispatch and clock control on the behavioral clock.

Referring to FIG. 38, the interface synthesis of procedure calls further generates the modified time advance network (MTAN) 2504 to control simulation time advance during procedure calls across HDL and HAL domains. The generated FSMs 3802, 3803, 3804 for procedure calls runs on the free running uncontrolled clock (Uclock) and the FSMs 3805 for the timed portion of the testbench (synthesized by testbench synthesis) runs on the behavioral clock generated by the MTAN 2504. Testbench synthesis also generates the FSMs for the generation and control of DUT clocks. The MTAN 2504 has additional contributions from the generated FSMs 3802-3804 for procedure calls and is used to stop simulation time advance immediately during a procedure call. This MTAN 2504 has the "stopsim" contributions from all the generated FSMs 3802-3804 for procedure calls running on the uncontrolled clock (uclock) and controls the behavioral clock on which the FSM (created by testbench synthesis) for the timed portion of the testbench runs. FIG. 39 shows an illustrative waveform for simulation time advance control during a procedure call across HDL and HAL domains, wherein the behavioral clock is stopped during the course of the procedure call. The behavioral clock is restarted when the procedure call returns from the HAL domain and HDL simulation time advances.

To communicate with the HAL domain for transferring the procedure call argument, the interface-synthesis-generated FSMs 2503 may use the SCE-MI protocol. In doing so, the generated infrastructure of this interface synthesis can also co-exist with legacy and manually written SCE-MI models in the same system. This also makes it possible for this interface synthesis to be potentially applicable in all SCE-MI compliant emulation platforms.

The inferred FSMs 2503 are responsible for communicating data across the HDL and HAL boundaries. To maintain procedural call semantics, the inferred FSMs 2503 may control simulation time advance using the MTAN 2504 by asserting a signal "stopsim" as illustrated in the FIG. 25. This is explained later in more detail for each type of procedural call. On the HAL domain, a simulation kernel thread 2505 interacts with the HDL domain to process requests from the HDL domain. This simulation kernel thread 2505 is an automatically inserted thread in the user's HAL application. The user may spawn other threads in the system to control the HDL simulation time advance through the invocation of HAL-to-HDL tasks/functions.

Figure 26:
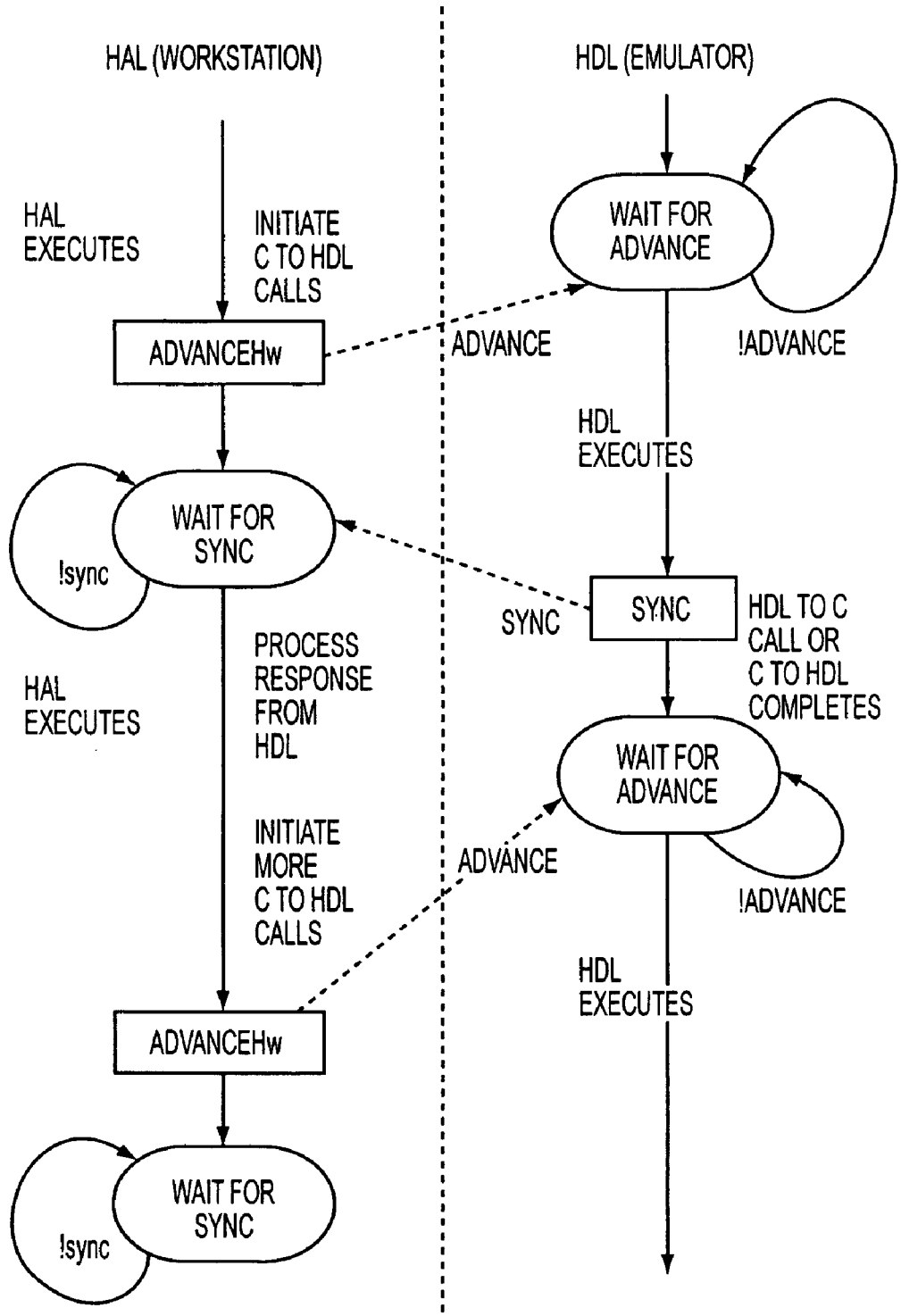
FIG. 26 is a functional block diagram of an illustrative system, particularly showing interaction between the HDL and HAL domains of the system to guarantee repeatability of the system execution and verification results.

Other than being SCE-MI compliant, the interface synthesis also creates a repeatable system. Such repeatability is not guaranteed in a pure SCE-MI based system. To provide repeatability of the system in this case, the time advance network 2504 and the simulation kernel thread 2505 may communicate with each other using the advance/sync protocol to cause the user threads 2501 to interact with the HDL domain only at defined time points in the simulation. The "advance" signal in FIG. 25 represents that the HAL domain has completed its processing, which means that the HDL domain can now advance the simulation. The "sync" signal in FIG. 25 represents that the HDL domain has reached a synchronization state, and at this point, the HAL domain is given CPU cycles to complete its processing. FIG. 26 illustratively shows this execution control flow between the HDL and HAL domains. The above-described interface synthesis technology further allows for hardware and software to run concurrently to achieve maximum performance using transaction pipes. Even so, synchronization and repeatability can still be maintained.

Thus, the described interface synthesis may be built on top of the testbench synthesis technology and may enhance the capability and application of testbench synthesis to user-defined HAL threads, tasks, and functions. The interface synthesis may also generate a SCE-MI compliant system such that SCE-MI models can co-exist and the system can potentially run on any SCE-MI compliant platform. The interface synthesis further allows SCE-MI clock control to co-exist with behavioral clock generation, and ensures that the compiled system is repeatable and based on high-performance transactions. Such interface synthesis further allows for hardware and software to execute concurrently, resulting in increased performance without compromising repeatability.

5.2.1 HAL-to-HDL Exported Tasks and Functions

Figure 27:
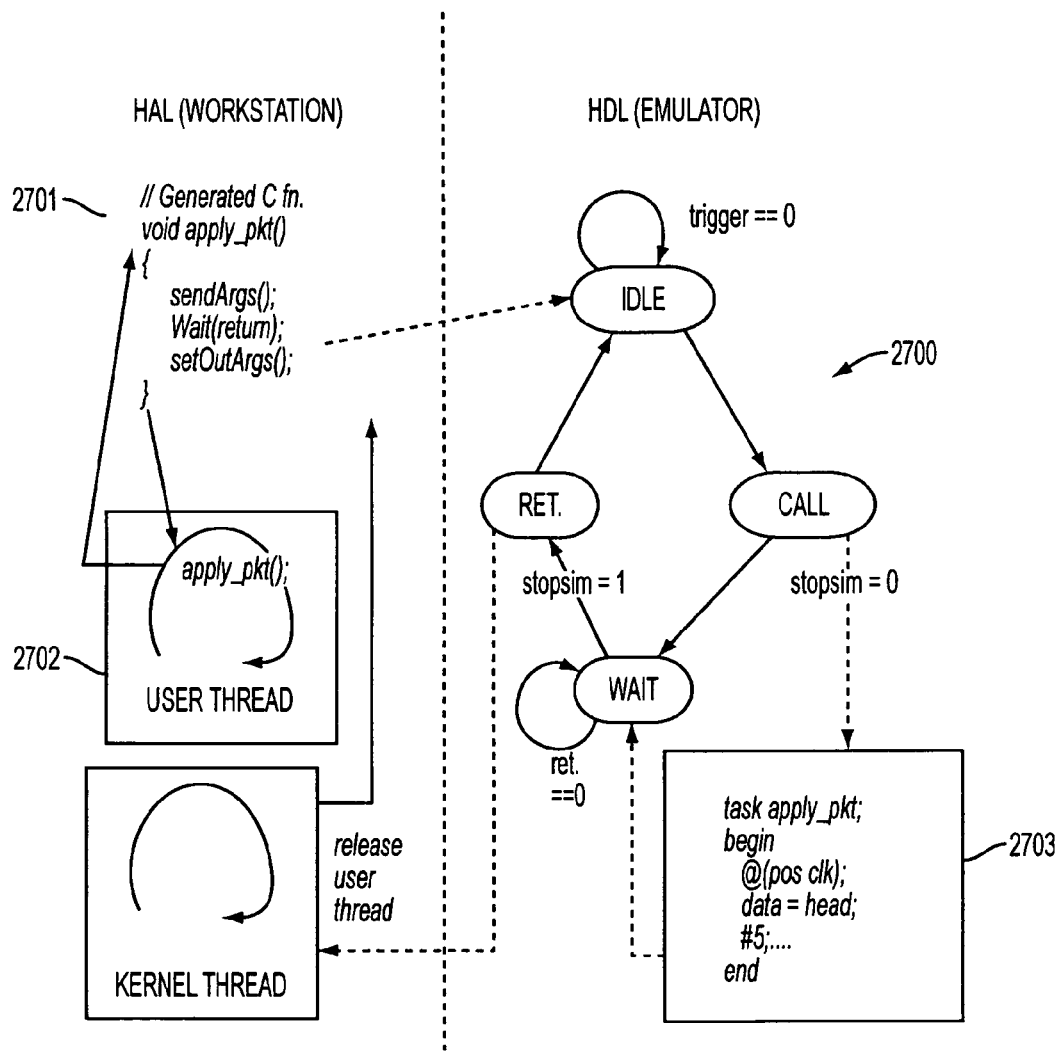
FIG. 27 is a functional block diagram of an illustrative inferred infrastructure for a time-consumptive HAL-to-HDL procedural call.

FIG. 27 shows an illustrative inferred infrastructure for a time-consumptive HAL-to-HDL procedural call. On the HAL domain, a C (for example) procedure stub 2701 is generated for the apply_pkt( ) procedure, which when called by a user thread 2702 communicates with an FSM 2700 on the HDL domain and blocks the user thread 2702 until the procedure returns. The FSM 2700 handles the calling and returning of the Verilog task apply_pkt 2703. The FSM 2700 also controls the time advance of the simulation, including stopping the time advance when the procedure returns and control is transferred to HAL domain. The direction of execution flow is shown in FIG. 27 by arrows, starting from the apply_pkt( ) procedural call.

The FSM 2700 may be inferred in HDL for HAL-to-HDL calls, and is in an IDLE state until a HAL-to-HDL call is made from the HAL side at some point in simulation. Upon a call from the HAL side, the infrastructure sends a message to the FSM 2700 to start the HAL-to-HDL procedural call. The FSM 2700 moves to the CALL state, which applies the trigger for the HAL-to-HDL task to run and advances simulation in the HDL domain. While the task runs and simulation advances, the FSM 2700 enters a WAIT state and waits for the task to finish. At the end of the task, the FSM 2700 stops simulation time advance and sends the task outputs to the HAL domain. The apply_pkt( ) C call on the HAL domain then returns.

5.2.2 HDL-to-HAL Imported Tasks and Functions

Figure 28:
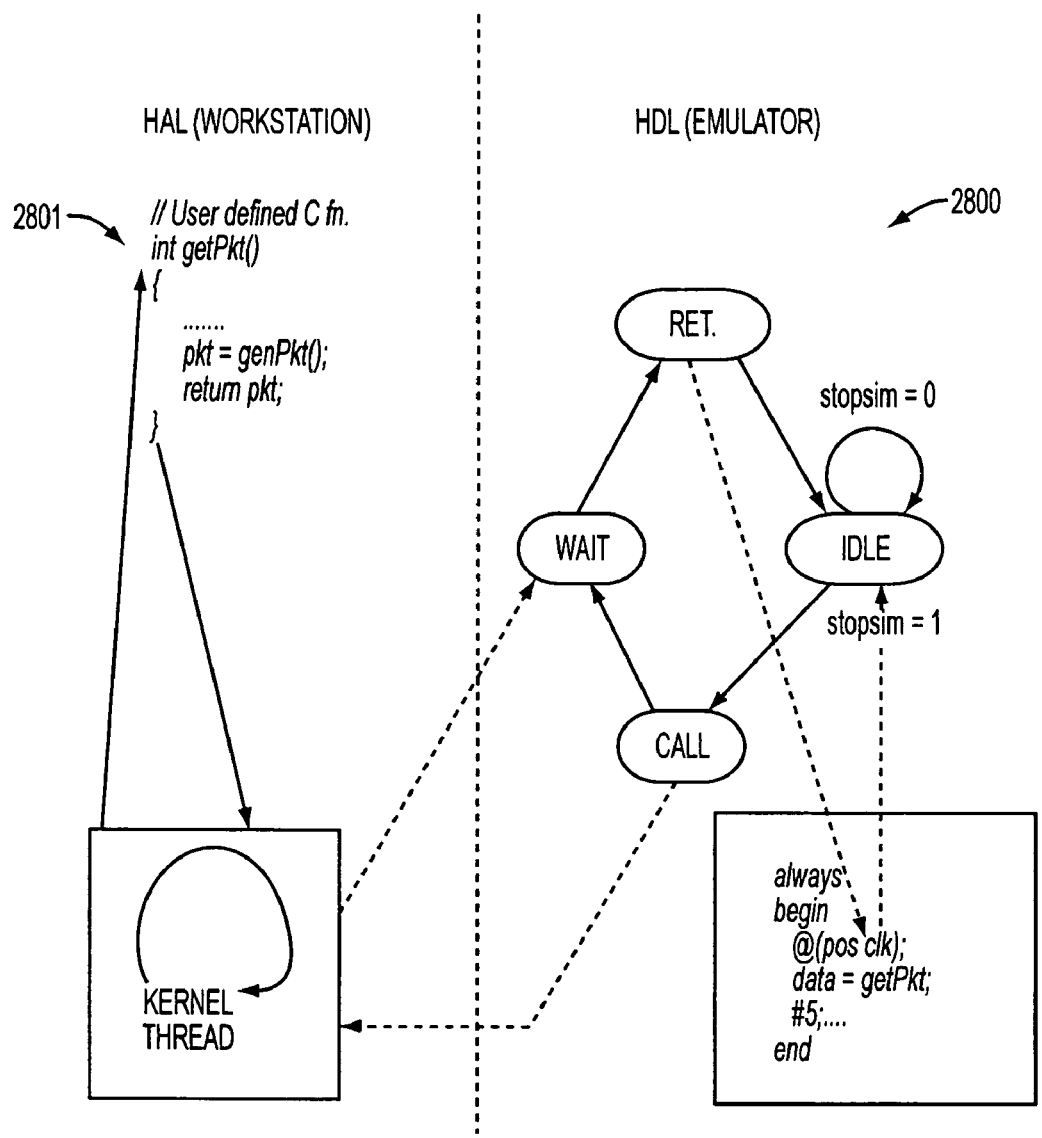
FIG. 28 is a functional block diagram of an illustrative inferred infrastructure for a non-time-consumptive HDL-to-HAL function call.

FIG. 28 shows an illustrative inferred infrastructure for an HDL-to-HAL (in this example, HDL-to-C) function call that returns in zero time. HDL-to-C imported tasks may also consume simulation time before returning by virtue of calling one or more C-to-HDL exported tasks. An FSM 2800 on the HDL domain is triggered on a call, and in response the FSM 2800 handles the calling of C procedure getPkt( ) 2801. The FSM 2800 also stops simulation time advance until the procedure 2801 returns from the HAL domain. The getPkt( ) C procedure 2801 is defined by the user and called by the infrastructure when the HDL domain calls the procedure 2801. The direction of execution flow is shown by arrows starting from the getPkt call from the HDL domain.

Figure 29:
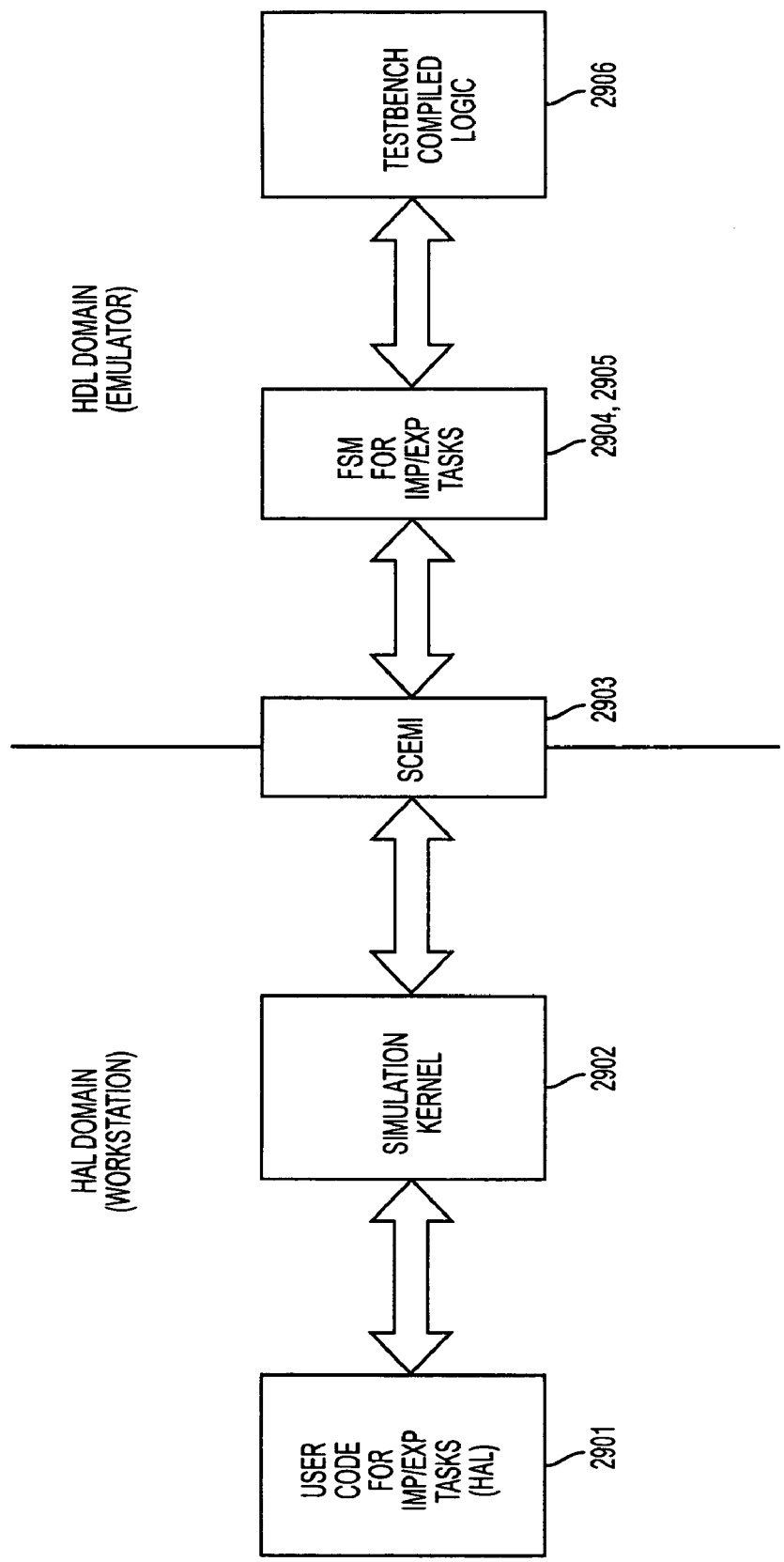
FIG. 29 is a functional block diagram of an illustrative environment having a HAL domain and an HDL domain.

Referring to FIG. 29, an illustrative environment may include user code 2901 on the HAL domain for import and export tasks, as well as a simulation kernel 2902. The HDL domain includes FSMs 2904, 2905 for import and export tasks, as well as testbench 2906. The HAL and HDL domains communicate via SCE-MI channel 2903. Because an imported task can call one or more exported tasks, an imported task needs a relatively more complex infrastructure than an imported function. The imported task FSM 2904 needs to be aware of the exported task FSM 2905 and to perform handshaking with the exported task FSM 2905, in order to control time advance of the simulation. The HAL domain infrastructure is multithreaded to handle multiple simultaneous imported task calls. Unlike an imported function wherein the HDL domain can be blocked globally until the function returns from C in zero time, the imported task call first globally blocks the HDL until the imported task returns control to HDL through an exported task call. On an exported task call, only the HDL block that called the imported task is blocked. This is because simulation can advance through the other HDL blocks (exported tasks called from within imported tasks) in the system.

Figure 30:
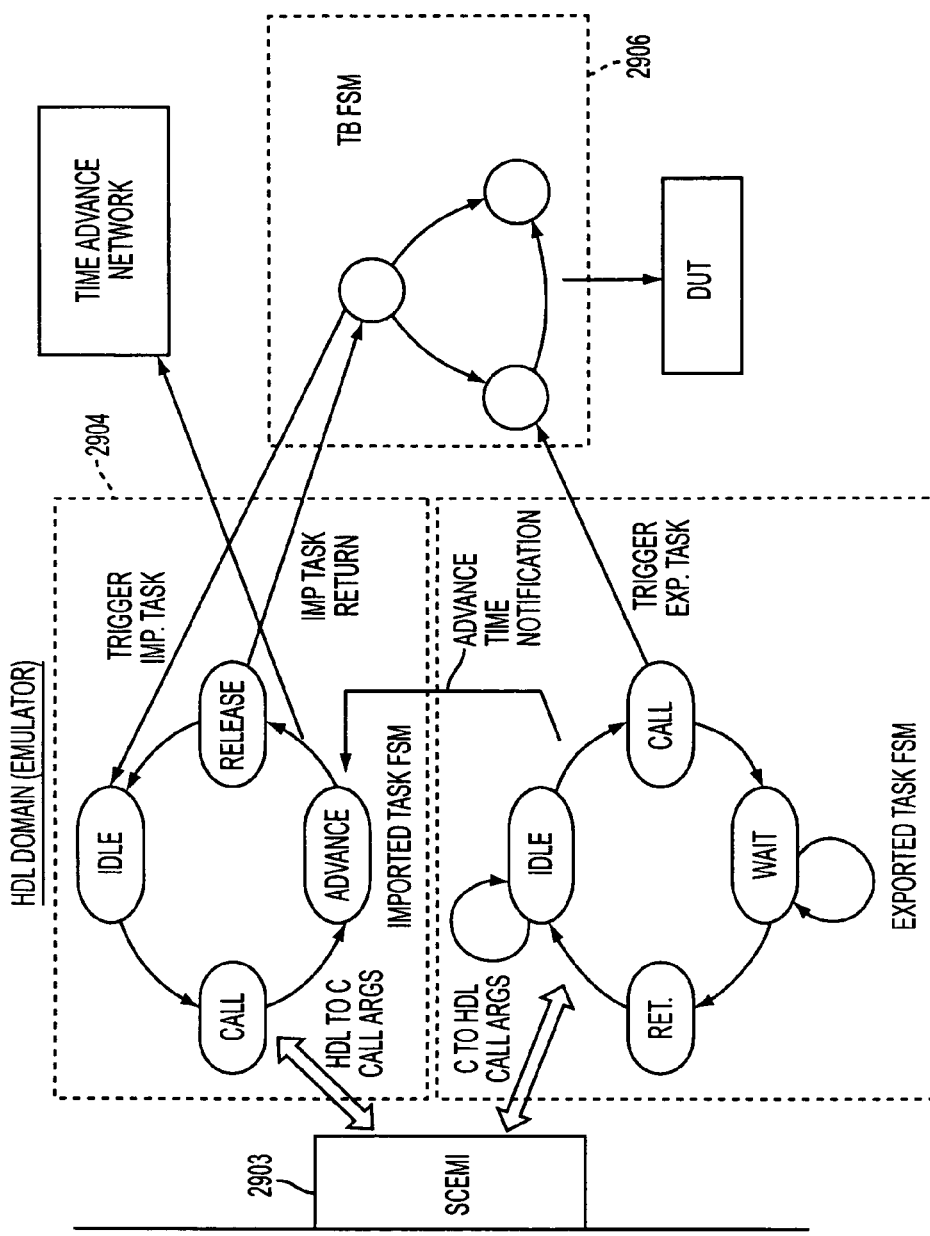
FIG. 30 is a functional block diagram showing additional detail of the HDL domain of FIG. 29.
Figure 31:
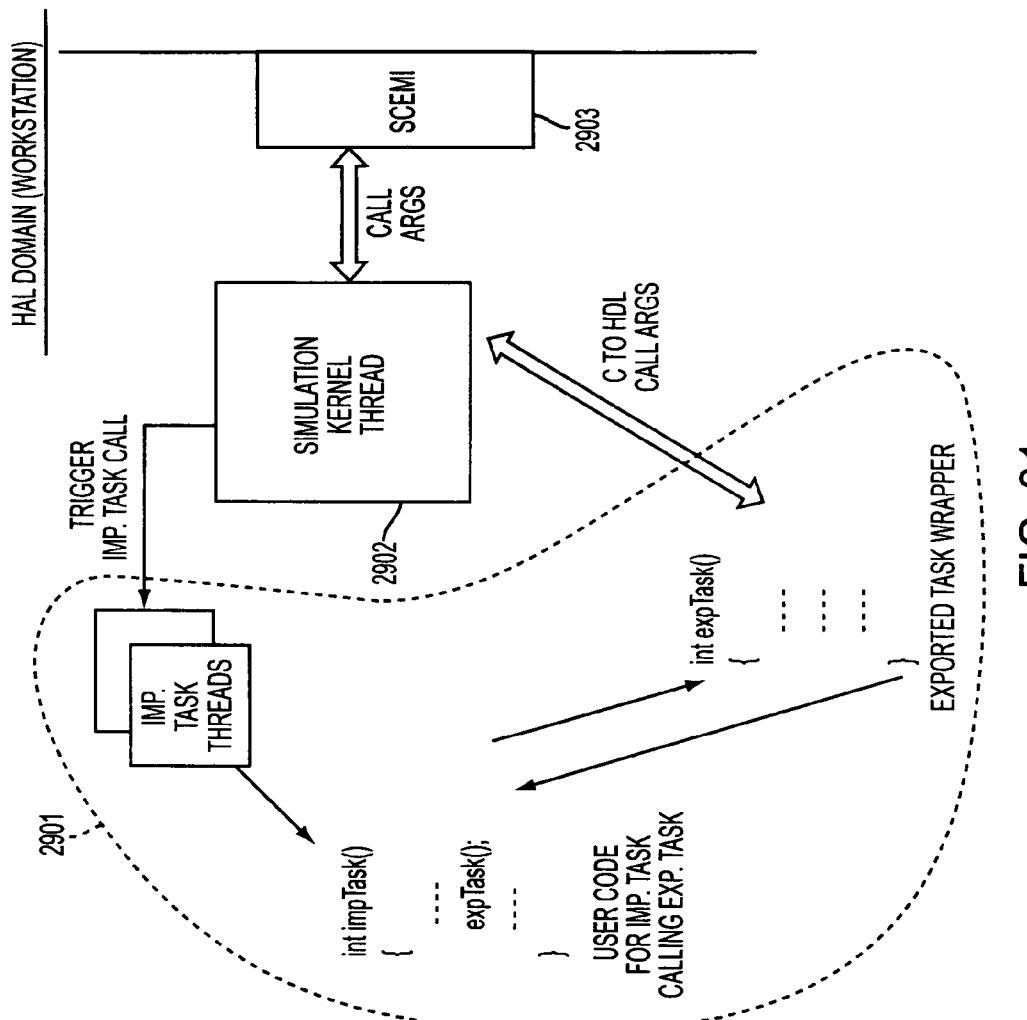
FIG. 31 is a functional block diagram showing additional detail of the HAL domain of FIG. 29.

Reference is now made to FIGS. 30 and 31, which show the HDL and HAL domains of FIG. 29, respectively, in additional detail. In response to an imported task call from the HDL domain, the imported task FSM 2904 moves to a CALL state, which causes simulation time advance to stop and causes a message to be sent over the SCE-MI channel 2903 to the HAL domain to start the imported task on a dedicated C thread. Once started, the C thread runs and calls the user-defined C task. The imported C task may then call exported tasks to advance simulation time. Since simulation time advances through the exported task FSM 2905, the imported task FSM 2904 now needs a notification from the exported task FSM 2905 identifying which imported task has started the exported task. Accordingly, once all of the imported tasks started by the imported task FSM 2904 have called their corresponding exported tasks, then the imported task FSM 2904 enters an ADVANCE state, and an advance in simulation time is globally scheduled. At this point, the imported task FSM 2904 starts the simulation time advance, and the scheduled exported tasks run along with other HDL blocks until one or more exported tasks return. Exported task returns are handled similarly as explained in the exported task section. The exported task call in the imported C task returns and may call more exported tasks. Alternatively, the C task may return to the HDL domain. Upon return of the imported C task, the imported task FSM 2904 releases the wait for the HDL block that had called the imported task and restarts simulation time advance.

The HAL domain maintains synchronization between the imported and exported task FSMs 2904, 2905 by monitoring the imported task threads that have started and managing the forwarding of imported-exported mapping information (which may indicate which exported task is called from within which imported task) to the HDL domain, so that the imported task FSM 2904 can decide when to advance time (since all started tasks return either through exported task calls or explicit returns). This, in itself, maintains repeatability of the system by providing that the HDL domain runs only when all of the imported task threads on the HAL domain return control back to the HDL domain.

The imported and exported task FSMs 2904, 2905 are also responsible for handling the task disable semantics of exported tasks. Since the call chain of exported tasks and imported tasks spans through the HDL and HAL domains, the disabling of a task higher in the call chain means that imported and exported tasks down the chain should be disabled as well. Multiple iterations between the HAL and HDL domains may need to be performed in order to disable the full chain. This means that the longer the chain to be disabled, the larger the number of transactions that are needed between the HDL and HAL domains, thereby reducing performance.

However, aspects of the present invention provide a unique way to disable all exported tasks in a chain using only a single transaction. To achieve this, in response to a disable of an imported task (either directly or indirectly), the imported task FSM 2904 sends a transaction to the HAL domain indicating which imported task is disabled. The HAL domain maintains a dynamic data structure representing each chain of imported and exported tasks that are currently executing. Upon receiving the disable notification, the HAL domain determines which chain the disabled task is part of and sends information back to the exported task FSM 2905 indicating all of the tasks in that chain that need to be disabled. Upon receiving this information, the exported task FSM 2905 disables all the exported tasks down the chain. Thus, this approach saves multiple transactions between the HDL and HAL domains when disabling an imported/exported task chain.

5.2.3 Time Advance and Synchronization

Figure 32:
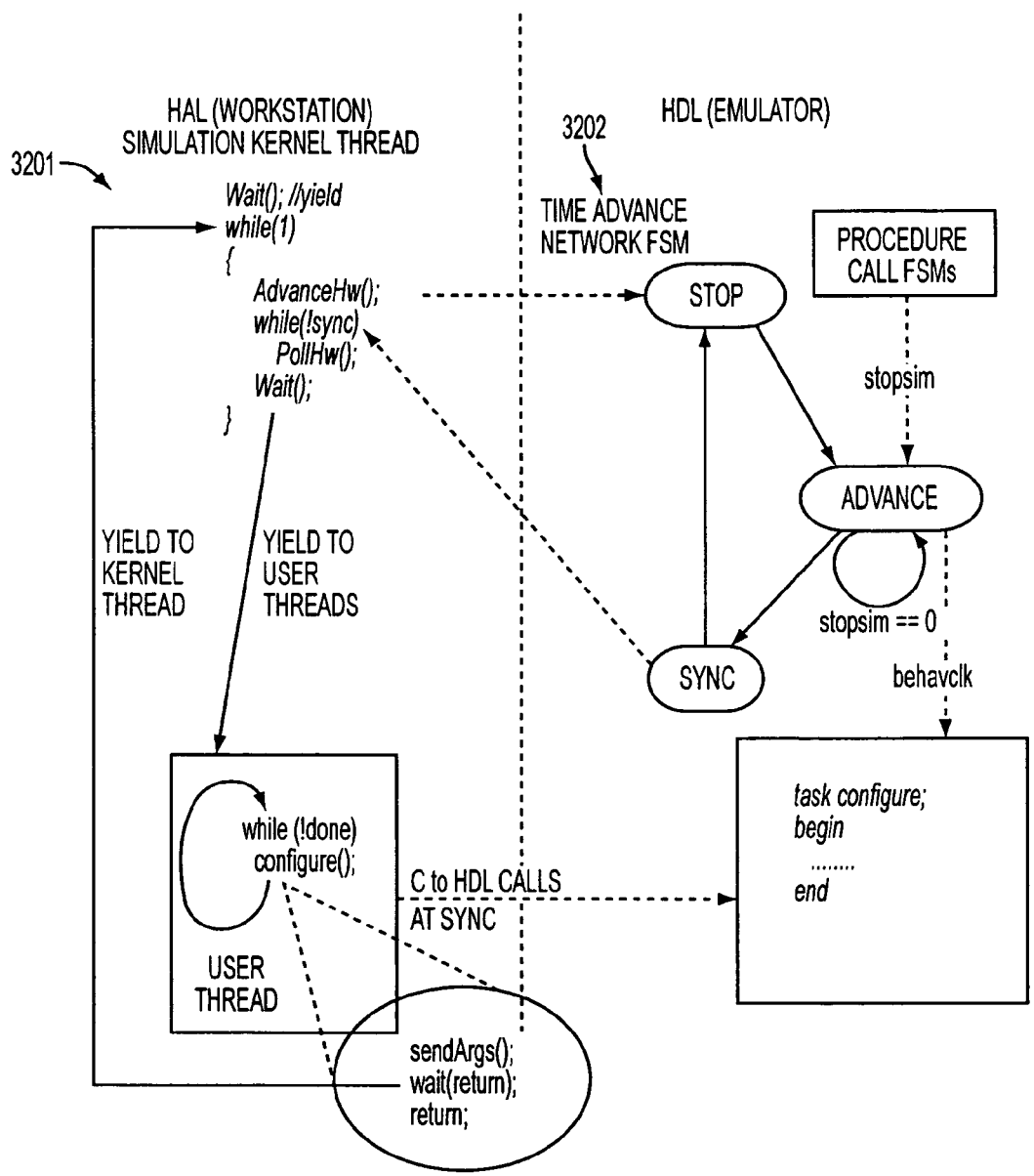
FIG. 32 is a functional block diagram illustratively showing how an infrastructure may guarantee repeatability of a system.

Since the HAL and HDL domains run independently of each other while needing to communicate with each other, it is difficult to achieve repeatability of simulation results. This is an issue in the case of asynchronous HAL domains needing to communicate with an HDL domain through the use of C-to-HDL calls or transaction pipes. FIG. 32 shows an example of how the infrastructure may guarantee repeatability of the system. A simulation kernel thread 3201 yields to user threads in the HAL domain only at defined time points when time advance network FSM 3202 in the HDL domain is in a STOP state (which is a SYNC state). The FSM 3202 domain reaches the SYNC state when some activity happens at the HAL-HDL boundary, such as an HDL-to-HAL call or the completion of an HAL-to-HDL call. A yield may be implemented easily using a wait( ) function provided by a standard non-pre-emptive C threading system such as SystemC. This mechanism ensures that at any point of time, either the user HAL domain or the HDL domain is running and all interactions between the two domains occur only at defined points in time. It should be noted that although synchronization is performed, it is performed only at transaction boundaries and not at every simulation cycle.

5.2.4 Transaction Pipes

Figure 33:
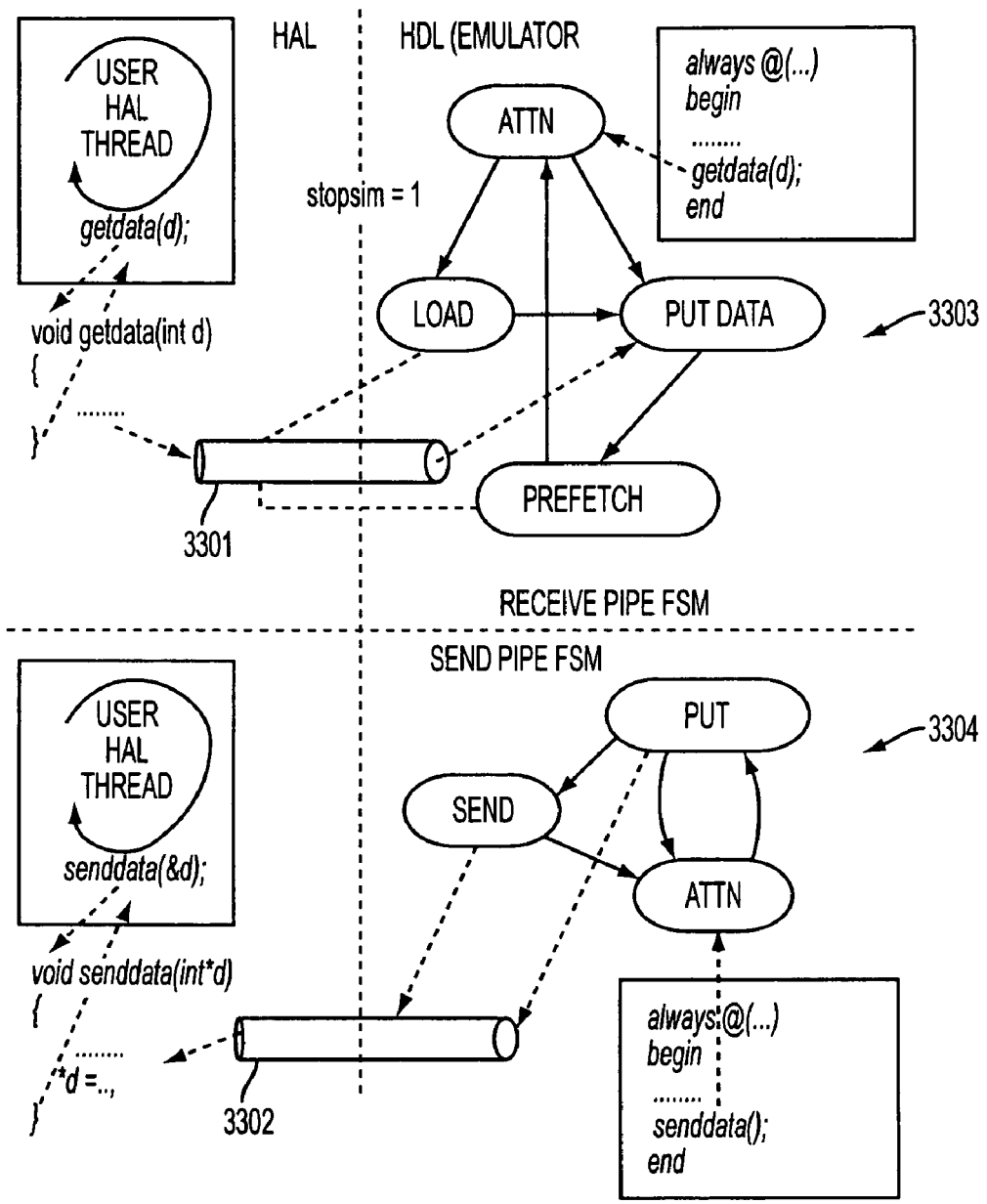
FIG. 33 is a functional block diagram of an illustrative synthesized infrastructure for transaction pipes.

From the point of view of the sender, transaction pipes are non-blocking procedure calls that return immediately without waiting for the other side to consume the data. Data is buffered and pipelined in the infrastructure and eventually delivered to the receiver. High performance is maintained by reducing the number of transactions that would otherwise be needed, and by allowing for simultaneous execution of sender and receiver threads. FIG. 33 shows an example of a synthesized infrastructure for transaction pipes 3301 and 3302. Data is buffered on both the HAL and HDL domains. Due to the streaming nature of the transaction pipes 3301, 3302, both the HDL and HAL threads are allowed to run concurrently while maintaining synchronization by blocking the receiver of data if data is not available from the other side (stopsim=1 in FIG. 33). In a system with good transaction density, a receive pipe FSM 3303 on the HDL domain should mostly be in either the ATTN, PUT, or PREFETCH states as shown and should rarely need to block simulation time advance (which would be the LOAD state as shown). It should be noted that the PREFETCH state actually occurs concurrently with simulation time advance. Similarly, in a send pipe FSM 3304 also on the HDL domain, a SEND state as shown occurs concurrently with simulation time advance. Send and receive transaction pipes 3301, 3302 may force synchronization with the other domain (in this example, the HAL domain) by explicitly flushing the transaction pipe in the procedure call from the sender domain. The infrastructure for the receive and send pipes is described in more detail in the following sections.

Figure 40:
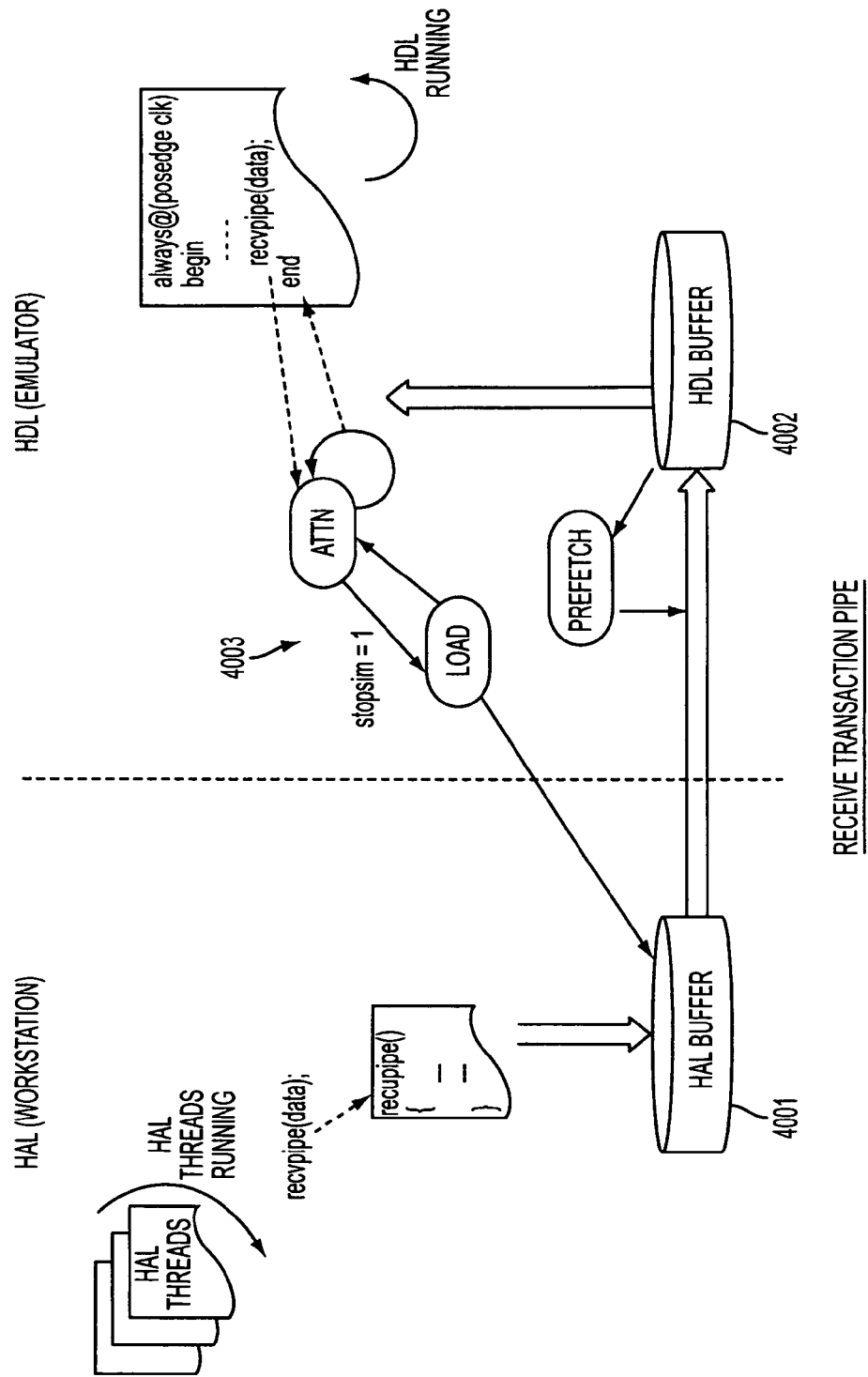
FIG. 40 is a functional block diagram of an illustrative inferred infrastructure for a receive transaction pipe, where data is sent from the HAL domain and received on the HDL domain.

FIG. 40 shows an illustrative inferred infrastructure for a receive transaction pipe, where data is sent from the HAL domain and received on the HDL domain. Two layers of data buffering 4001, 4002 are shown, one on the HAL domain and other on the HDL domain. The HDL buffer 4002 is periodically prefetched (the PREFETCH state in FIG. 40) from the HAL domain to facilitate the concurrent execution of the HAL and HDL domains without the need to block simulation time advance. However, repeatability is still guaranteed by the fact that when the HDL domain requests data and data is not available in the HDL buffer 4002 (in case the HAL domain is running slower), an FSM 4003 stops simulation time advance and enters the LOAD state, wherein it loads the HAL side buffer 4001 into the HDL buffer 4002 and returns to the ATTN state to resume simulation time advance. The prefetch operation/mechanism reduces the possibility of the FSM 4003 entering the LOAD state too often and thus maximizes the duration of concurrent execution of HDL and HAL components. This concurrent execution of both the domains, with only rare HDL simulation stalls, provides for a very high performance streaming system.

Figure 41:
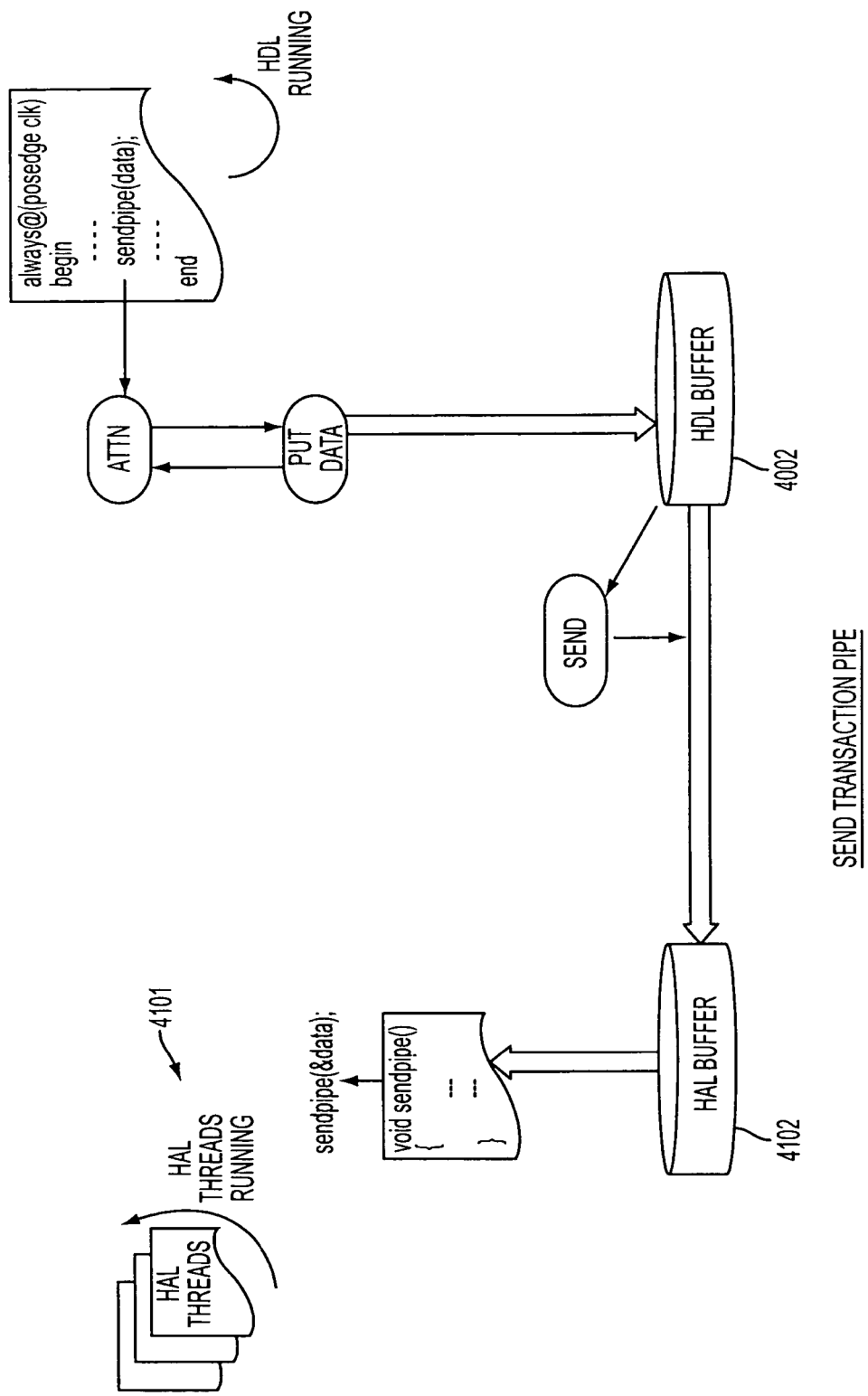
FIG. 41 is a functional block diagram of an illustrative inferred infrastructure for a send transaction pipe, where data is sent from the HDL domain and received on the HAL domain.

FIG. 41 shows illustrative inferred infrastructure for a send transaction pipe where data is sent from the HDL domain and received on the HAL domain. In this case as well, data is buffered and sent concurrently (the SEND state in FIG. 41.) to the HAL domain while HDL domain is advancing and producing more data (the PUT DATA state in FIG. 41). On the HAL domain, HAL thread 4101 can concurrently run with the HDL time advance and consume the data from a HAL buffer 4102. In the event that there is no data in the buffers, the HAL thread 4101 is automatically blocked to ensure repeatability of the system. This, combined with receive transaction pipes, provides a two-way streaming communication that has a high performance due to concurrent execution of both the HDL and HAL domains and also produces repeatable results across simulation runs.

5.3 Implementation of OBHV

An illustrative implementation of an OBHV system, as shown below, has two "always" blocks, one that generates the clock and the other that is sensitive to the clock and that makes ILFC calls.

```
always
begin
    #5 clk = 1;
    #5 clk = 0;
end
always @(posedge clk)
begin
    if(get_data)
```

```
      begin
         get_new_data(one_more, data1);
         if(one_more)
            get_new_data(one_more, data2);
      end
   end
```

The two "always" blocks are transformed using methods similar to the ones described herein in Section 1.0, except that the following signals are also brought out. First, ILFC1 and ILFC2 signals are path execution conditions for the two ILFCs. These are signals that arrive at least one behavioral clock before the actual clk arrival where the ILFCs would need to be called. Also, S0 and S1 signals represent states in the clock generator block that lead to posedge or negedge of clk respectively. This is illustrated in FIG. 37.

Figure 34:
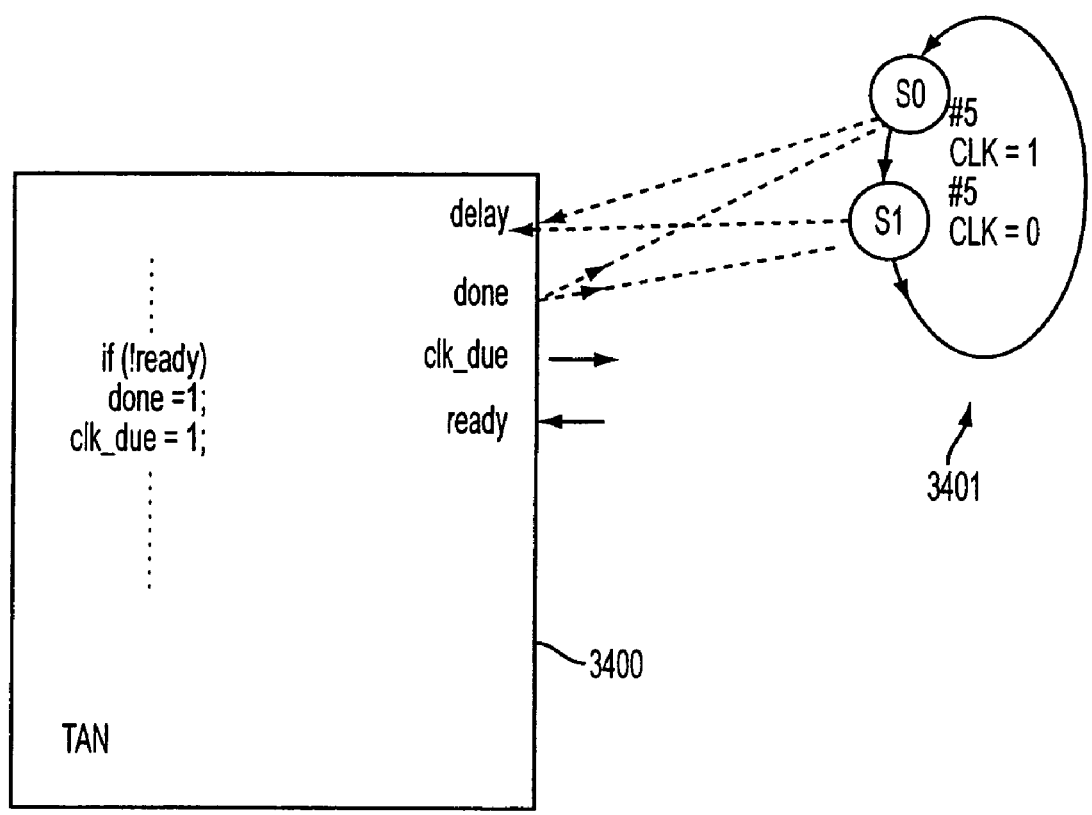
FIG. 34 is a functional block diagram of an illustrative modified time-advance network for OBHV optimization.

Referring to FIG. 34, an illustrative MTAN 3400 is shown having an enhanced interface for predicting clock arrival at least one behavioral clock cycle in advance and for stopping the generation of all clocks in the system one behavioral clock in advance, as well as a clock generator process. Conceptually, the MTAN 3400 has a delay port dedicated to a process (e.g. an "always" block). In the normal behavioral compile, this delay port has a "delay" input and a "done" output. A process, such as process 3401, sends a delay value to the "delay" input that the process 3401 desires to wait, and the MTAN 3400 asserts the "done" output when the delay value has been reached. For OBHV systems, a special delay port is introduced in the MTAN 3400 that the clock generator processes hook into. This special delay port has a "clk due" output that the MTAN 3400 asserts when it determines that the next time advance will also mature the delay for this special delay port. This will occur at least one behavioral clock cycle before the actual advance. The special delay port also has a "ready" input that indicates to the MTAN 3400 whether the process associated with the special delay port is ready for delay maturity. In the condition when "clk_due" is active and "ready" is not, the MTAN 3400 would actually defer time advance until "ready" is asserted. The clock generator process is dedicated to clock generation. Clock generator processes are the only processes allowed to have delays in an OBHV system.

Figure 35:
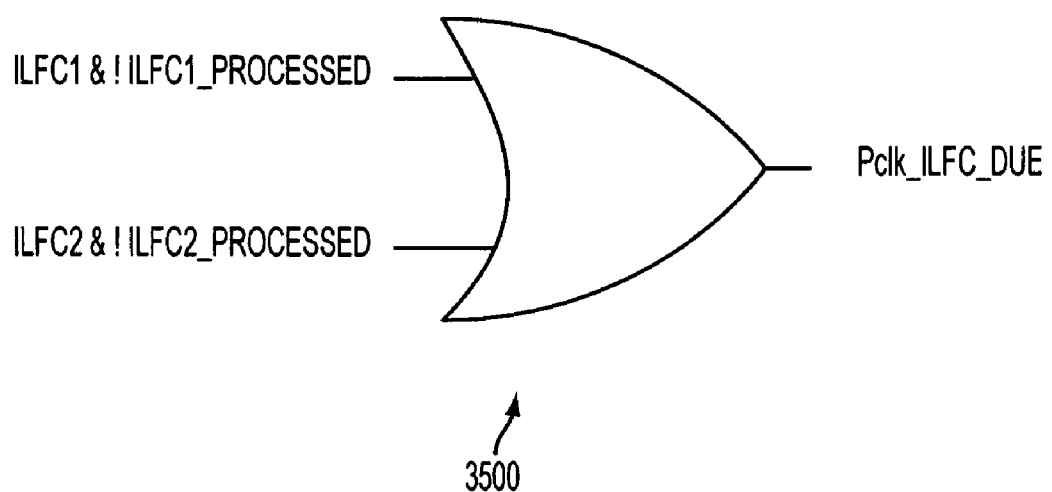
FIG. 35 is a logic schematic of illustrative ILPC call control logic for OBHV optimization.
Figure 36:
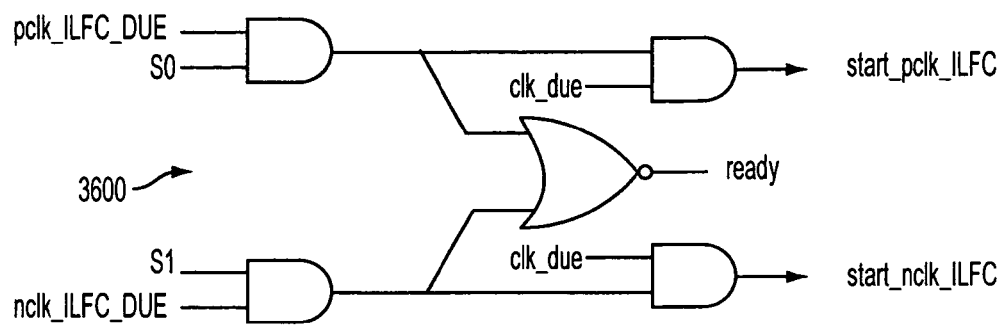
FIG. 36 is a logic schematic of illustrative ILPC dispatch logic for OBHV optimization.

Referring to FIGS. 35 and 36, illustrative ILFC call control and dispatch logic is shown. ILFC control logic 3500 and ILFC dispatch logic 3600 together receives ILFC arrival signals and 'clk' arrival signals generated by the clock generator process, and provides the "ready" signal to the MTAN 3400. The logic shown in FIGS. 35 and 36 together also dispatches the IFLCs, if any. In particular, ILFC control logic 3500 receives ILFC arrival signals ILFC1, ILFC2 and based on them generates a "pclk_ILFC_due" signal that indicates that ILFCs are due. In this example, ILFCs are due on the posedge of "clk." Logic 3600 receives the "pclk_ILFC_due" signal (for a posedge of "clk") and a "nclk_ILFC_due" signal (for a negedge of "clk," if present), clock generator states S0, S1, and the "clk_due" signal from the MTAN 3400. In response, ILFC dispatch logic 3600 generates the "ready" signal of the MTAN 3400 as well as signals "start_pclk_ILFC" and "start_nclk_ILFC," which are each a start signal used by the ILFC dispatcher.

Figure 37:
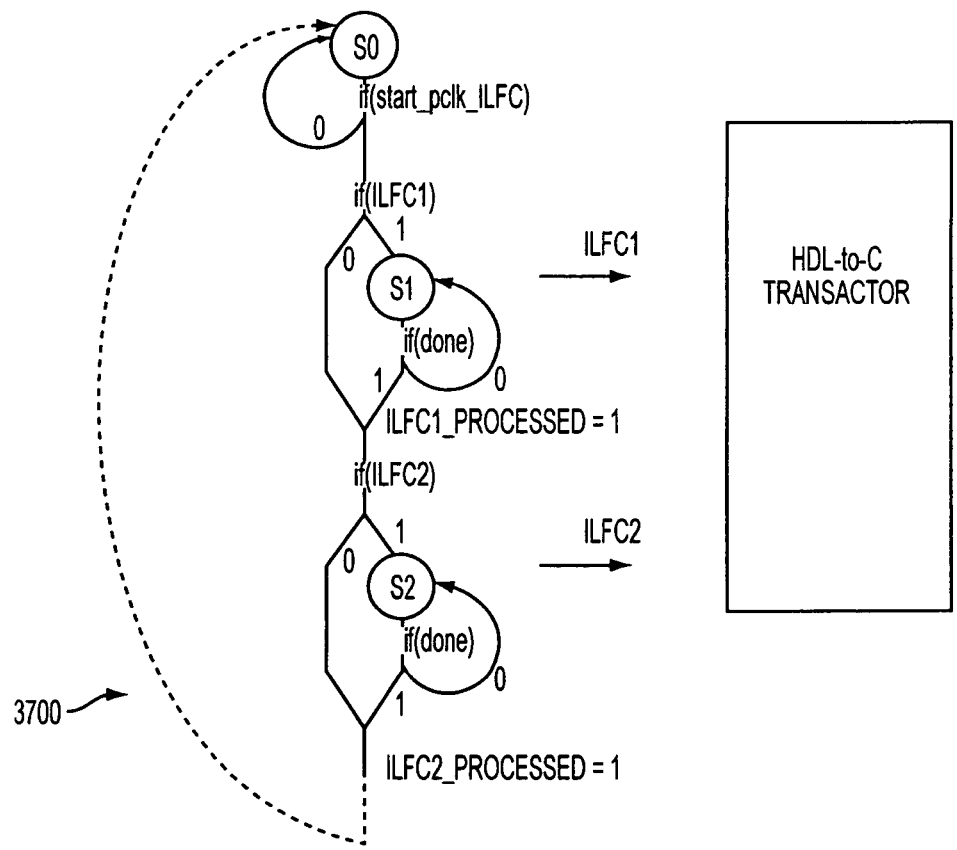
FIG. 37 is a state diagram of an illustrative finite state machine on the behavioral clock that sends out the various ILPCs for OBHV optimization.

Referring now to FIG. 37, an illustrative FSM 3700 on the behavioral clock is shown that sends out the various ILFCs for one "always" block, serially and in execution order, in response to receiving the 'start_pclk_ILFC' (or 'start_nclk_ILFC') signals from the ILFC control logic. The FSM 3700 also maintains ILFC_processed signals that are sent back to the ILFC control logic 3500 to determine whether all ILFCs have been sent.

ILPC calls are like any other zero-time Verilog task calls, and hence any output/input arguments of these calls are updated blockingly when the calls returns. Thus, the output of one ILPC call can potentially affect the data inputs to the next ILPC call in the same process. The output of one ILPC call can even affect the control conditions that decide the invocation of the next ILPC call. Aspects of the present invention provide for this inter-dependency and match the expected semantics, even in OBHV processes. For example, referring to the following code:

```
// ILPC prototype.
task get_random;
   inout [31:0] seed;
   output one_more;
   output [31:0] data;
   begin
   end
endtask
always @(posedge clk)
begin
   if(get_data)
   begin
      get_random(seed, one_more, data1);
      if(one_more)
         get_random(seed, one_more, data2);
   end
end
```

In this illustrative code, it should be noted that the transformation of the last always block is performed assuming RTL task semantics for 'get_random'. This means that any call to this task is assumed to complete within zero time. Indeed, the illustrative OBHV infra-structure discussed thus far guarantees this by ensuring that the posedge of 'clk' does not arrive until after all ILPCs have been called and their results have been obtained. The inter-dependencies of further ILPCs on the outputs of ILPCs that have already been called is maintained by (a) keeping ILPC outputs in behavioral clocked registers until 'clk' arrives, which in any event are maintained by the ILPC infra-structure discussed in previous sections, and (b) creating combinational paths from ILPC output to other ILPC inputs and control conditions for execution paths. As the ILPCs are called in the correct execution order, whenever an ILPC call returns, its outputs immediately affect (1) the execution path conditions, which decide which ILPC needs to be called next, if any, (2) inputs to the next ILPC calls, if any, and 3) the next state values for all registers clocked in the associated process, in the event that there are no ILPCs left and 'clk' is about to arrive.

5.3.1 Zero-Time Sequential (Behavioral) Operations (ZTSO)

The OBHV techniques discussed so far allow for embedding multi-cycle behavioral clocked FSMs into FSMs clocked by design clocks. The behavioral cycles taken by these behavioral FSMs are transparent to the design FSM, and they actually appear to the design FSM as zero-time operations as they occur just prior to the arrival of the next clock edge of the clock for the FSM using delta cycles. These delta cycles (as in a behaviorally-compiled FSM) occur on the edges of the behavioral clock in the compiled netlist. Thus, the OBHV techniques also allow for zero-time sequential behavioral operations to be performed in otherwise RTL-clocked blocks. This is an important capability in transaction-based testbenches where it is helpful in processing data either before an ILPC call to encode data transactions or after ILPC calls to decode incoming transactions to be applied to the DUT. The invocation of these operations is very similar to invocation of ILPCs, with the difference that ZTSOs are computed on the hardware itself by helper behavioral-clocked FSMs. These operations are zero-time unbounded loops, as well as functions and zero-time tasks containing zero-time unbounded loops.

The helper FSMs are extracted out during the compile process by identifying start and end points for the operation in the process, by enumerating inputs/outputs for the desired helper FSM, which is decided by all the reads and writes of design signals within the code segment contained by the identified start and end points, and by transforming the code segment into a behavioral clocked FSM similar to behavioral task/function transformation techniques. The call start and completion signals are provided by the OBHV ILPC techniques discussed in the previous sections. In addition, the call to the helper FSM is transformed similar to an OBHV ILPC call. The inter-dependencies between ILPCs and zero-time operations are also resolved in a manner similar to one described previously.

For example, the code below shows inter-dependencies amongst ILPCs and ZTSOs in an illustrative OBHV system:

```
task ILPC1
    input [7:0] data_in;
    output [7:0] data_out;
    output action;
    begin
    end
endtask
task ILPC2
    input [7:0] data_in;
    output [7:0] data_out;
    begin
    end
endtask
task ILPC3
    input [7:0] data_in;
    output [7:0] data_out;
    begin
    end
endtask
always @(posedge clk)
begin
    // Zero-time operation 1
        while(..)
            begin
                data1 = ..;
            end
    //ILPC1.
    ILPC1(data1, data2, action);
    if(action)
        ILPC2(data2, data3);
    else
        ILPC3(data2, data3);
    // Zero-time operation 2
    while(..)
        begin
            .. = data3;
        end
end
```

Figure 42:
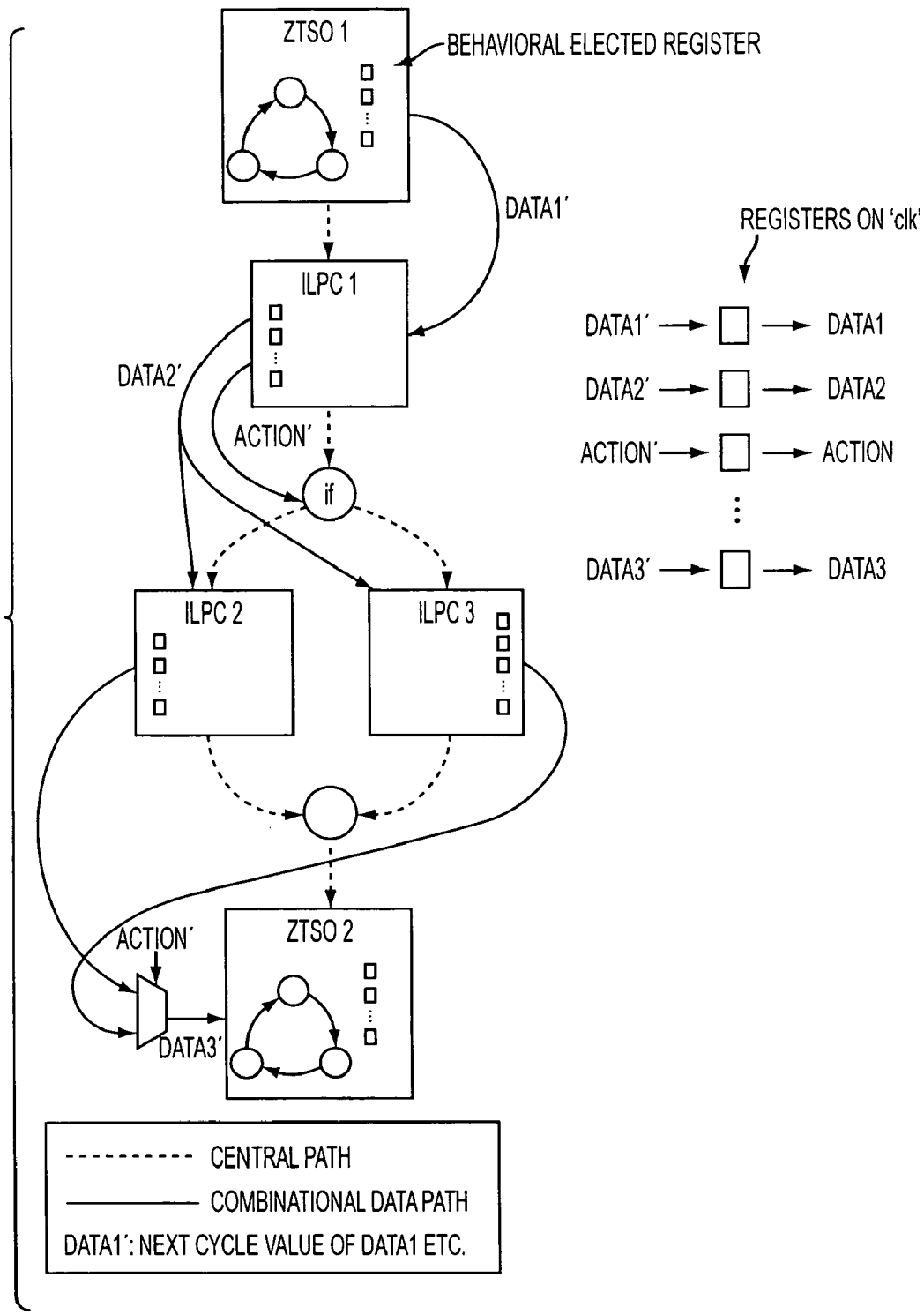
FIG. 42 is a functional block diagram showing the transformation of code that illustrates inter-dependencies amongst ILPCs and ZTSOs in an illustrative OBHV system.

FIG. 42 shows the transformation of the above example. In particular, FIG. 42 illustrates, with broken lines, the control flow of such a process. The control flow is very similar to any RTL process transformation that assumes the various ILPC/ZTSO operations to be like any other zero-time combinational operations. FIG. 42 further illustrates, with solid lines, the data-flow dependencies between the various ILPC/ZTSO operations. Again, these are very similar to RTL process transformations where they are combinational data paths. These are, in essence, the next cycle values of the associated signals up to that point in execution. These intermediate values are denoted in FIG. 42 as data1', data2', etc. The various ILPC/ZTSO blocks contain behavioral clocked registers to hold values of their outputs. In addition, registers on the design clock 'clk' are shown in FIG. 42 that will eventually update the design signals data1, data2, with their respective next cycles values data1', data2', etc. The order of priority for the various ILPC/ZTSO blocks in this illustrative process, defined by the execution order, is ZTSO1, ILPC1, ILPC2, ILPC3, and ZTSO2, in decreasing order of priority. Serialization logic ensures that, at any point, ILPCs/ZTSOs with higher priorities are executed first.

6.0 Conclusion

Thus, among other features, a transparent and user-friendly system (and its creation) has been described for managing interaction between a workstation and an emulator. Even though the emulator and the workstation run concurrently, the system as a whole is nevertheless able to generate, and in most cases guarantee, repeatable verification results. The system may utilize a communication interface for synchronizing and passing data between multiple HDL threads (running on the emulator) and simultaneously-running multiple HAL threads (running on the workstation). Any or all of the steps for creating the system as described herein may be performed automatically or semi-automatically with the involvement of a user. In addition, computer software may be created and stored on any known computer-readable medium to automatically or semi-automatically perform some or all of the various steps and configurations involved in generating the novel systems and interfaces described herein. No claim element should be interpreted under 35 U.S.C. 112, paragraph six, unless that claim element includes the phrase "means for," "step for," or "steps for."

What is claimed is:

1. A method for creating a system for verifying a digital circuit design using a testbench that comprises an HDL component and an HAL component, the method comprising:
    synthesizing the digital circuit design into a structural model;
    transforming the HDL component of the testbench into a structural model maintaining exact simulation semantics, wherein the structural model includes a plurality of finite state machines (FSMs) corresponding to timed and untimed parallel blocks of code in the behavioral model;
    mapping the FSMs onto a reconfigurable hardware platform; and
    automatically synthesizing a communication interface between the FSMs running on the reconfigurable hardware platform and the HAL component of the testbench running on a sequential computation platform.

2. The method of claim 1, wherein the communication interface between the HDL component and the HAL component is defined using inter-language procedural calls and transaction pipes.

3. The method of claim 1, wherein the HDL and HAL components interface with each other using the System-Verilog DPI standard.

4. The method of claim 3, wherein a SCE-MI standard-compliant model co-exists with the System-Verilog DPI standard-compliant interface.

5. The method of claim 2, wherein a SCE-MI standard compliant model co-exists with the interface using inter-language procedural calls and transaction pipes.

6. The method of claim 1, further including generating a global scheduler configured to control synchronized execution of the FSMs on the reconfigurable hardware platform and the HAL components on the sequential computation platform.

7. The method of claim 1, wherein verification results are repeatable across multiple runs of the verification system.

8. The method of claim 7, wherein the HAL component is a non-pre-emptive multi-threaded environment.

9. The method of claim 8, wherein the HAL component and the HDL component run concurrently with each other and communicate with each other using transaction pipes while maintaining repeatability of the results.

10. The method of claim 7, wherein the HAL component and the FSMs of the HDL component run concurrently with each other and communicate with each other using transaction pipes while maintaining repeatability of the results.

11. The method of claim 1, wherein the step of synthesizing the interface includes a compiler automatically synthesizing the interface, wherein the interface is SCE-MI standard-compliant.

12. The method of claim 1, wherein the interface is at least partially defined using the RTL subset of VHDL.

13. The method of claim 1, further including implementing disable semantics of imported tasks for disabling a dynamically-linked caller chain.

14. A computer-readable medium storing computer-executable instructions for performing the steps recited in claim 1.

15. The method of claim 1, wherein for a defined subset of behavioral Verilog HDL, a 1:1 ratio between a user clock count and a behavioral clock count is guaranteed during a pure HDL execution activity.

16. The method of claim 15, further including:

predicting an edge arrival of a user clock edge during the pure HDL execution activity; and predicting pending ILPC and transaction pipe calls to be executed on the user clock edge at least one behavioral clock cycle in advance.

17. The method of claim 15, further including:

stopping the user clock; and executing a pending ILPC/transaction pipe on the HAL side, wherein output is obtained from the sequential computation platform before the user clock starts again.

18. The method of claim 17, wherein multiple sequential ILPC and transaction pipe calls are handled and executed in simulation execution order.

19. The method of claim 18, wherein data flow dependencies between sequential ILPC calls are maintained.

20. The method of claim 18, wherein sequential ILPC calls have inter-dependencies and wherein an output of one ILPC is blockingly assigned and is read as an input in a next ILPC.

21. The method of claim 18, wherein dataflow dependencies between ILPC calls and zero-delay sequential behavioral operations are maintained.

* * * * *